(12) United States Patent
Sakuma et al.

(10) Patent No.: US 11,430,500 B2
(45) Date of Patent: *Aug. 30, 2022

(54) SEMICONDUCTOR STORAGE DEVICE

(71) Applicant: KIOXIA CORPORATION, Tokyo (JP)

(72) Inventors: Haruka Sakuma, Mie (JP); Kiwamu Sakuma, Mie (JP); Masumi Saitoh, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/189,097

(22) Filed: Mar. 1, 2021

(65) Prior Publication Data

US 2022/0093149 A1 Mar. 24, 2022

(30) Foreign Application Priority Data

Sep. 23, 2020 (JP) .............................. JP2020-158360

(51) Int. Cl.
| | |
|---|---|
| *G11C 11/22* | (2006.01) |
| *H01L 29/51* | (2006.01) |
| *H01L 27/11592* | (2017.01) |
| *H01L 27/11587* | (2017.01) |
| *H01L 27/1159* | (2017.01) |

(52) U.S. Cl.
CPC ........ *G11C 11/223* (2013.01); *G11C 11/2255* (2013.01); *G11C 11/2257* (2013.01); *G11C 11/2273* (2013.01); *G11C 11/2275* (2013.01); *G11C 11/2277* (2013.01); *H01L 27/1159* (2013.01); *H01L 27/11587* (2013.01); *H01L 27/11592* (2013.01); *H01L 29/516* (2013.01)

(58) Field of Classification Search
None
See application file for complete search history.

(56) References Cited

U.S. PATENT DOCUMENTS

| | | | |
|---|---|---|---|
| 6,522,567 | B2 | 2/2003 | Iwanari |
| 6,606,261 | B2 | 8/2003 | Gudesen et al. |
| (Continued) | | | |

FOREIGN PATENT DOCUMENTS

| | | |
|---|---|---|
| JP | H07-093968 A | 4/1995 |
| JP | 2001-351373 A | 12/2001 |
| (Continued) | | |

*Primary Examiner* — Tan T. Nguyen
(74) *Attorney, Agent, or Firm* — Kim & Stewart LLP

(57) ABSTRACT

A semiconductor storage device includes a plurality of gate electrodes, a semiconductor layer facing the plurality of gate electrodes, a gate insulating layer arranged between each of the plurality of gate electrodes and the semiconductor layer. The gate insulating layer contains oxygen (O) and hafnium (Hf) and has an orthorhombic crystal structure. A plurality of first wirings is connected to the respective gate electrodes. A controller is configured to execute a write sequence and an erasing sequence by applying certain voltages to at least one of the first wirings. The controller is further configured to increase either a program voltage to be applied to the first wirings in the write sequence or an application time of the program voltage in the write sequence after a total number of executions of the write sequence or the erasing sequence has reached a particular number.

20 Claims, 28 Drawing Sheets

(56) References Cited

U.S. PATENT DOCUMENTS

| | | | |
|---|---|---|---|
| 7,139,192 B1* | 11/2006 | Wong | G11C 11/5628 365/185.03 |
| 7,420,833 B2 | 9/2008 | Dan et al. | |
| 9,685,565 B2* | 6/2017 | Mizutani | H01L 21/28229 |
| 11,195,858 B2* | 12/2021 | Suzuki | H01L 27/11585 |
| 2005/0237829 A1* | 10/2005 | Nakamura | G11C 16/30 365/199 |
| 2007/0165460 A1* | 7/2007 | Toki | G11C 11/5671 365/185.22 |
| 2010/0074016 A1* | 3/2010 | Higashitani | G11C 16/0483 365/185.17 |
| 2012/0314499 A1* | 12/2012 | Yuan | G11C 29/028 365/185.11 |
| 2013/0070532 A1* | 3/2013 | Nawata | G11C 16/10 365/185.22 |
| 2015/0179657 A1 | 6/2015 | Inumiya | |
| 2015/0302920 A1* | 10/2015 | Shibata | G11C 16/10 365/185.03 |
| 2018/0350829 A1* | 12/2018 | Tezuka | G11C 5/06 |
| 2019/0148406 A1 | 5/2019 | Liu | |
| 2019/0287599 A1 | 9/2019 | Higashi et al. | |

FOREIGN PATENT DOCUMENTS

| | | |
|---|---|---|
| JP | 2004-503052 A | 1/2004 |
| JP | 2005-108326 A | 4/2005 |
| JP | 2019-160374 A | 9/2019 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2020-158360, filed Sep. 23, 2020, the entire contents of which are incorporated herein by reference.

FIELD

Embodiments described herein relate generally to a semiconductor storage device.

BACKGROUND

A semiconductor storage device of a known type includes a substrate, a plurality of gate electrodes stacked in a direction intersecting a surface of the substrate. A semiconductor layer faces the gate electrodes and a gate insulating film is provided between the gate electrodes and the semiconductor layer. The gate insulating film comprises a memory storage unit that is capable of storing data. The memory storage unit includes an insulating charge storage layer formed of silicon nitride ($Si_3N_4$), a conductive charge storage layer functioning as a floating gate, and a ferroelectric film.

DETAILED DESCRIPTION

Figure 1:
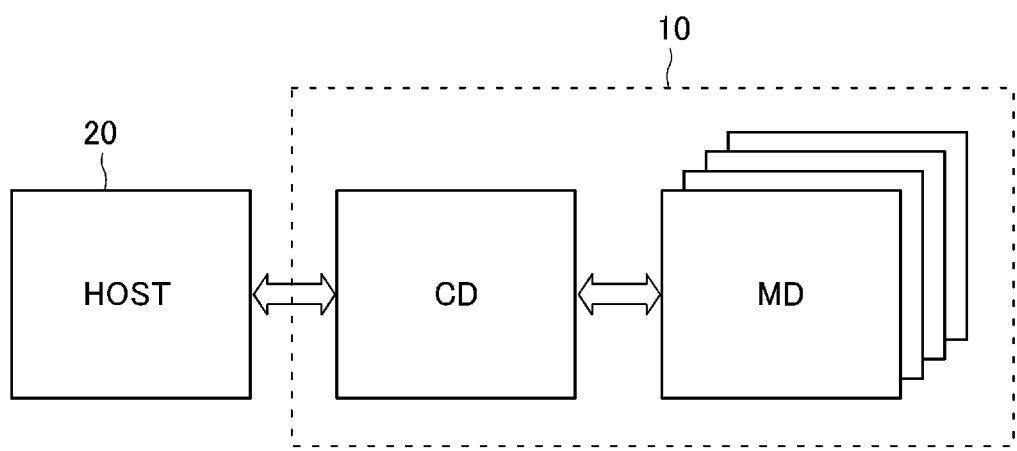
FIG. 1 is a schematic block diagram showing a memory system according to a first embodiment.

In general, according to one embodiment, a semiconductor storage device includes a plurality of gate electrodes, a semiconductor layer facing the plurality of gate electrodes, and a gate insulating layer between each of the plurality of gate electrodes and the semiconductor layer. The gate insulating layer comprises oxygen (O) and hafnium (Hf) and has an orthorhombic crystal structure. A plurality of first wirings are connected to the respective gate electrodes. A controller is configured to execute a write sequence and an erasing sequence by applying certain voltages to at least one of the first wirings. The controller is further configured to increase either a program voltage to be applied to one of the plurality of first wirings in the write sequence or an application time of the program voltage after a total number of executions of the write sequence or the erasing sequence has reached a particular number.

In general, according to one embodiment, a semiconductor storage device includes: a plurality of gate electrodes; a semiconductor layer facing the plurality of gate electrodes; a gate insulating film provided between the plurality of gate electrodes and the semiconductor layer; and a plurality of first wirings connected to the plurality of gate electrodes. This semiconductor storage device is executable for a write sequence and an erasing sequence. In the write sequence executed before the number of times of execution of the write sequence or the erasing sequence reaches a predetermined number of times, a program voltage having a first magnitude is supplied to one of the plurality of first wirings during a first supply time. In the write sequence executed after the number of times of execution of the write sequence or the erasing sequence reaches the predetermined number of times, a program voltage having a second magnitude is supplied to one of the plurality of first wirings during a second supply time. The second magnitude is larger than the first magnitude, or the second supply time is longer than the first supply time.

According to another embodiment, a semiconductor storage device includes: a plurality of gate electrodes; a semiconductor layer facing the plurality of gate electrodes; a gate insulating film provided between the plurality of gate electrodes and the semiconductor layer; a plurality of first wirings connected to the plurality of gate electrodes; and a second wiring connected to the semiconductor layer. This semiconductor storage device is executable for a write sequence and an erasing sequence. In the erasing sequence executed before the number of times of execution of the write sequence or the erasing sequence reaches a predetermined number of times, an erase voltage having a first magnitude is supplied to the second wiring during a first supply time. In the erasing sequence executed after the number of times of execution of the write sequence or the erasing sequence reaches the predetermined number of times, an erase voltage having a second magnitude is supplied to the second wiring during a second supply time. The second magnitude is larger than the first magnitude, or the second supply time is longer than the first supply time.

According to another embodiment, a semiconductor storage device includes a controller die including a memory cell, and a controller die connected to the memory die. The controller die inputs, after the number of times of execution of a write sequence or an erasing sequence reaches a first number of times, a command indicating increasing a voltage supplied to the memory cell in at least one of the write sequence and the erasing sequence to the memory die. The controller die inputs, after the number of times of execution of the write sequence or the erasing sequence reaches a second number of times larger than the first number of times, a command indicating further increasing a voltage supplied to the memory cell in at least one of the write sequence and the erasing sequence to the memory die.

Next, semiconductor storage devices according to one or more embodiments will be described with reference to the drawings. The following embodiments are merely examples, and are not intended to limit the scope of the present disclosure. The following drawings are schematic, and, in some cases, aspects or configurations may be omitted from the depictions for convenience of description. The same reference numerals are given to the common parts among a plurality of embodiments, and the particular description of such parts may be omitted from subsequent embodiments.

In the present specification, the term "semiconductor storage device" may refer to a memory die or a memory system including a controller die such as a memory chip, a memory card, and a solid-state drive (SSD). Further, the term "semiconductor storage device" may also refer to a configuration comprising a host computer, such as a smart phone, a tablet terminal, or a personal computer, to which a memory die, a memory system, or the like is attached, integrated, or connected.

In the present specification, the term "control circuit" may mean a peripheral circuit such as a sequencer provided on a memory die, a controller die, or a controller chip connected to the memory die, or a device including both of the peripheral circuit and the controller die or the controller chip.

In the present specification, when a first component is said to be "electrically connected" to a second component, the first component may be directly connected to the second component, or the first component may be connected to the second component via a wiring, a semiconductor member, or a transistor. For example, when three transistors are connected in series, the first transistor is "electrically connected" to the third transistor even when the second transistor is in an OFF state.

In the present specification, when the first component is said to be "connected between" the second component and the third component, it may mean that the first component, the second component, and the third component are connected in series, and the second component is connected to the third component via the first component.

In the present specification, when a circuit or the like is said to "conduct" or "connect" two wirings or the like, it may mean that the circuit or the like includes a transistor or a switch-like component, and the transistor or the switch-like component is in an ON state and provided in a current path between the two wirings.

In the present specification, a direction parallel to an upper surface of a substrate is referred to as an X direction, a direction that is parallel to the upper surface of the substrate and is perpendicular to the X direction is referred to as a Y direction, and a direction orthogonal to the upper surface of the substrate is referred to as a Z direction.

In the present specification, a direction along a predetermined plane may be referred to as a first direction, a direction intersecting the first direction along the predetermined plane may be referred to as a second direction, and a direction intersecting the predetermined plane may be referred to as a third direction. The first direction, the second direction, and the third direction may or may not correspond to any one of the X direction, the Y direction, and the Z direction.

In the present specification, expressions such as "upper" and "lower" are generally based on distance from the substrate. For example, a direction going away from the substrate along the Z direction is referred to as "upper," "upward" or the like, and a direction approaching the substrate along the Z direction is referred to as "lower" or the like. A lower surface or a lower end of a certain component means a surface or an end portion of the component on a substrate side, and an upper surface or an upper end of the certain component means a surface or an end portion of the component on a side opposite to the substrate. A surface intersecting the X direction or the Y direction is referred to as a side surface or the like.

First Embodiment

Memory System 10

FIG. 1 is a schematic block diagram showing a memory system 10 according to a first embodiment.

The memory system 10 reads, writes, and erases user data stored in a memory in response to a signal transmitted from a host computer 20. The memory system 10 is, for example, a memory chip, a memory card, an SSD, or other systems capable of storing user data. The memory system 10 includes a plurality of memory dies MD that store the user data, and a controller die CD connected to the plurality of memory dies MD and the host computer 20. The controller die CD includes, for example, a processor, a RAM (random access memory), and the like, and performs processing such as conversion between a logical address and a physical address, bit error detection and correction, garbage collection or compaction, and wear leveling.

Figure 2:
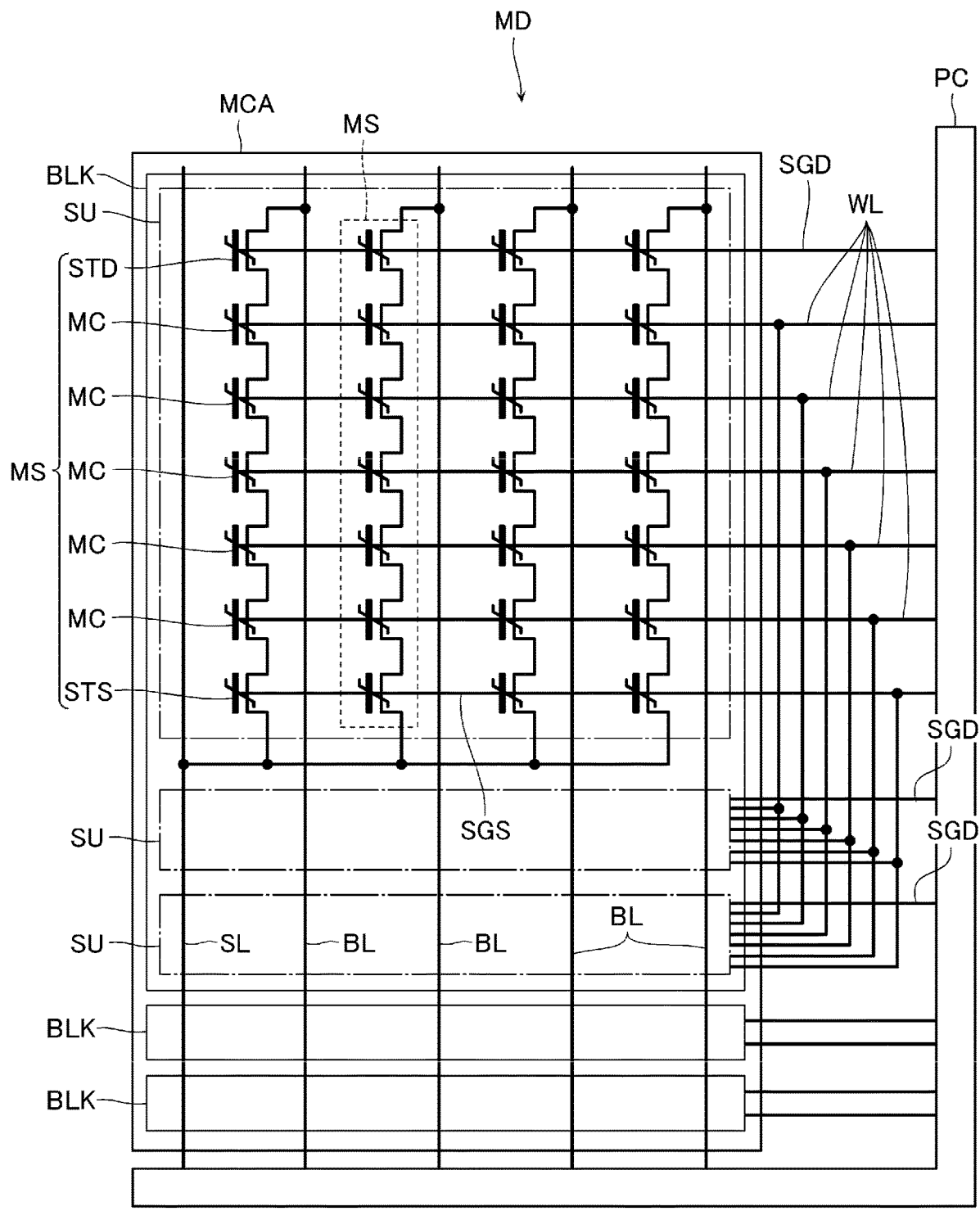
FIG. 2 is a schematic circuit diagram showing a memory die.

FIG. 2 is a schematic circuit diagram showing one of the memory dies MD. As shown in FIG. 2, the memory die MD includes a memory cell array MCA that stores data, and a peripheral circuit PC connected to the memory cell array MCA.

As shown in FIG. 2, the memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. The other end of each of the plurality of memory strings MS is connected to the peripheral circuit PC via a common source line SL.

The memory string MS includes a drain-side select transistor STD, a plurality of memory cells MC (also referred to as memory transistors), and a source-side select transistor STS that are connected in series between the bit line BL and the source line SL. Hereinafter, the drain-side select transistor STD and the source-side select transistor STS may be simply referred to as select transistors (STD, STS).

The memory cell MC is a field effect transistor (FET) including a semiconductor layer that functions as a channel region, a gate insulating film comprising a memory storage unit, and a gate electrode. A threshold voltage of the memory cell MC changes according to a state of the memory storage unit. The memory cell MC can store one bit of data or a plurality of bits of data. A different word line WL is connected to each of the gate electrodes of the plurality of memory cells MC in one memory string MS. These word lines WL are connected to all the memory strings MS in one memory block BLK.

Each of the select transistors (STD, STS) is also the field effect transistor including the semiconductor layer, the gate insulating film, and the gate electrode. Select gate lines (SGD, SGS) are connected to the gate electrodes of the select transistors (STD, STS), respectively. The drain-side select gate line SGD is provided corresponding to the string unit SU, and is commonly connected to all the memory strings MS in a string unit SU. The source-side select gate line SGS is commonly connected to all the memory strings MS in the plurality of string units SU.

The peripheral circuit PC includes, for example, a voltage generation circuit that generates an operating voltage and outputs the operating voltage to a voltage supply line, a decoding circuit that conducts the desired voltage supply line with the bit line BL, the source line SL, the word line WL, and the select gate lines (SGD, SGS), a sense amplifier circuit that detects a current or a voltage of the bit line BL, and the like.

Figure 3:
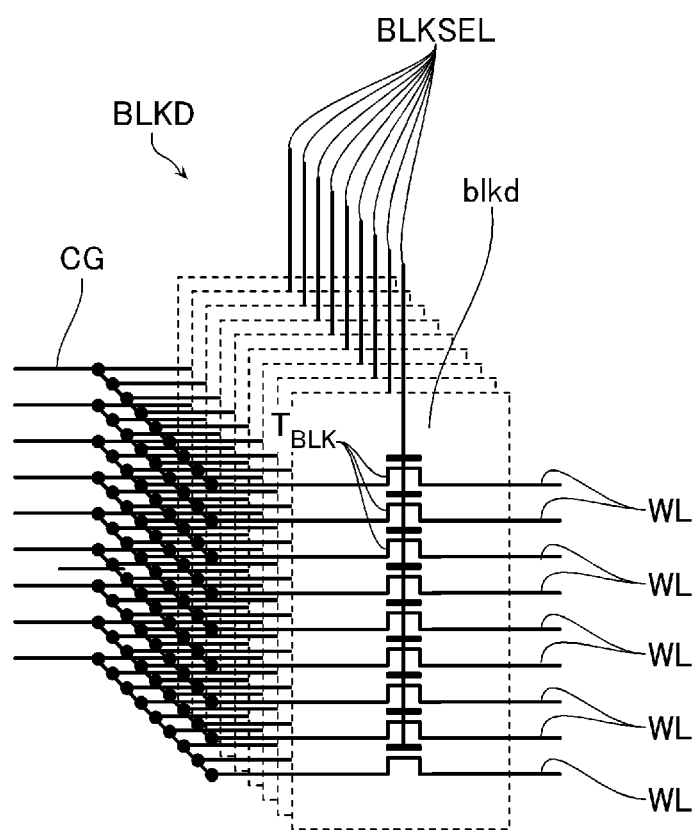
FIG. 3 is a schematic circuit diagram showing a peripheral circuit.

FIG. 3 is a schematic circuit diagram showing the peripheral circuit PC. FIG. 3 shows a block decoder BLKD electrically connected to the word line WL.

The block decoder BLKD includes a plurality of block decoding units blkd provided corresponding to the plurality of memory blocks BLK in the memory cell array MCA. The block decoding unit blkd includes a plurality of transistors $T_{BLK}$ provided corresponding to the plurality of word lines WLs in the memory block BLK. The transistor $T_{BLK}$ is, for example, a field effect NMOS transistor. A drain electrode of the transistor $T_{BLK}$ is connected to the word line WL. A source electrode of the transistor $T_{BLK}$ is connected to a wiring CG. A plurality of wirings CG are provided corresponding to all the transistors $T_{BLK}$ in the block decoding unit blkd. The wirings CG are connected to all the block decoding units blkd in the block decoder BLKD. The gate electrode of the transistor $T_{BLK}$ is connected to a signal supply line BLKSEL. A plurality of signal supply lines BLKSEL are provided corresponding to all the block decoding unit blkd. The signal supply lines BLKSEL are connected to all the transistors $T_{BLK}$ in the block decoding unit blkd.

In a read operation, a write sequence, and an erasing sequence, for example, one signal supply line BLKSEL corresponding to a block address in an address register is in an "H" state, and the other signal supply lines BLKSEL are in an "L" state. For example, a predetermined drive voltage having a positive magnitude is supplied to one signal supply line BLKSEL, and a ground voltage $V_{SS}$ or the like is supplied to the other signal supply lines BLKSEL. Accordingly, all the word lines WL in one memory block BLK corresponding to this block address are conducted with the voltage supply line described above via all the wirings CG. All word lines WL in the other memory blocks BLK are in a floating state.

Configuration of Memory Die MD

Figure 4:
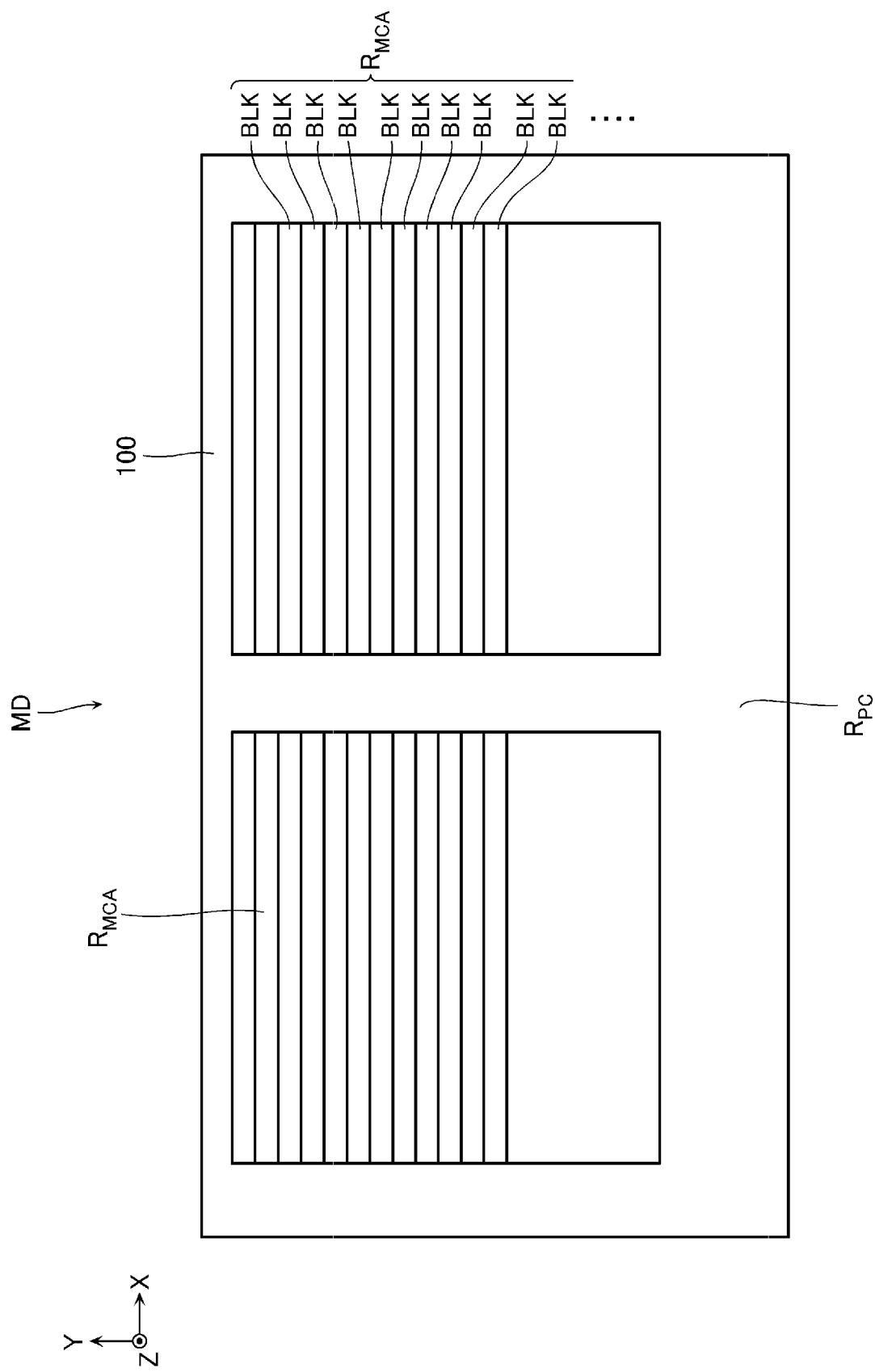
FIG. 4 is a schematic plan view of a memory die.

FIG. 4 is a schematic plan view of the memory die MD. As shown in FIG. 4, the memory die MD includes a semiconductor substrate 100. In the illustrated example, the semiconductor substrate 100 includes two memory cell array regions $R_{MCA}$ arranged along the X direction. Each memory cell array region $R_{MCA}$ includes a plurality of memory blocks BLK arranged along the Y direction. A peripheral circuit region $R_{PC}$ is formed at an end portion of the semiconductor substrate 100 in the Y direction.

Figure 5:
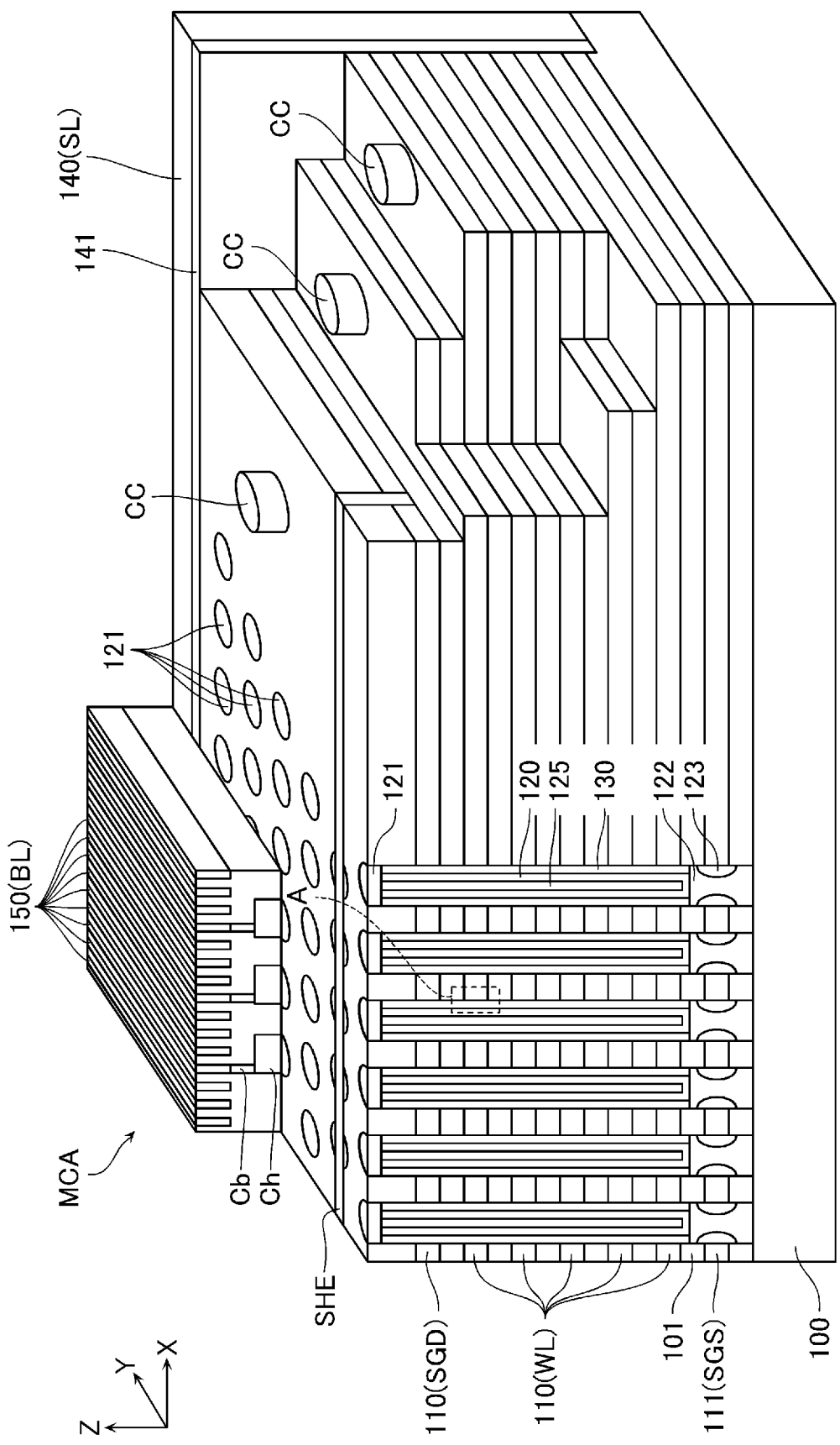
FIG. 5 is a schematic perspective view showing a memory die.
Figure 6:
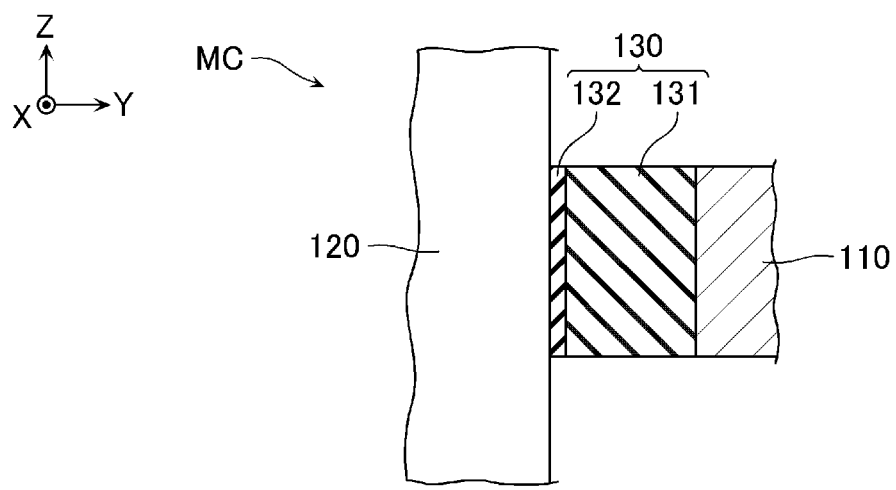
FIG. 6 is a schematic cross-sectional view showing a memory die.

FIG. 5 is a schematic perspective view showing the memory die MD. FIG. 6 is an enlarged schematic cross-sectional view of a portion shown by A in FIG. 5.

As shown in FIG. 5, the memory die MD includes a plurality of conductive layers 110 arranged along the Z direction above the semiconductor substrate 100, a plurality of semiconductor layers 120 extending along the Z direction, a plurality of gate insulating films 130 provided between the plurality of conductive layers 110 and the plurality of semiconductor layers 120, a conductive layer 140 connected to the semiconductor substrate 100, and conductive layers 150 provided above these components.

The semiconductor substrate 100 is, for example, a semiconductor substrate made of P-type silicon (Si) containing P-type impurities such as boron (B). A surface of the semiconductor substrate 100 includes, for example, an N-type well region containing N-type impurities such as phosphorus (P), a P-type well region containing P-type impurities such as boron (B), and a semiconductor substrate region other than the N-type well region and the P-type well region. The N-type well region, the P-type well region, and the semiconductor substrate region function as a part of a plurality of transistors Tr that make up the peripheral circuit PC, a plurality of capacitors, and the like.

The conductive layer 110 is a substantially plate-shaped conductive layer extending along the X direction. The conductive layer 110 may include a stacked film of a barrier conductive film made of titanium nitride (TiN) or the like and a metal film made of tungsten (W) or the like. The conductive layer 110 may include, for example, polycrystalline silicon containing impurities such as phosphorus (P) or boron (B). An insulating layer 101 made of silicon oxide ($SiO_2$) or the like is provided between the conductive layers 110 that are adjacent to each other. A part of the conductive layers 110 function as the word line WL (FIG. 2) and the gate electrodes of the plurality of memory cells MC (FIG. 2) connected to the word line WL. A part of the conductive layers 110 function as the drain-side select gate line SGD (FIG. 2) and the gate electrodes of the plurality of drain-side select transistors STD (FIG. 2) connected to the drain-side select gate line SGD.

A conductive layer 111 is provided below the conductive layers 110. The conductive layer 111 may include, for example, a stacked film of a barrier conductive film made of titanium nitride (TiN) or the like and a metal film made of tungsten (W) or the like. The insulating layer 101 made of silicon oxide ($SiO_2$) or the like is also provided between the conductive layer 111 and the lowermost conductive layer 110.

The semiconductor layers 120 are arranged in a particular pattern along the X direction and the Y direction. The semiconductor layer 120 functions as a channel region of the plurality of memory cells MC and the select transistors (STD, STS) that are provided in one memory string MS (FIG. 2). The semiconductor layer 120 is, for example, a semiconductor layer such as polycrystalline silicon (Si). The semiconductor layer 120 has a substantially bottomed cylindrical shape, and is provided with an insulating layer 125 such as silicon oxide in a center portion of the semiconductor layer 120. Outer peripheral surfaces of the semiconductor layers 120 are surrounded by the conductive layers 110 and face the conductive layers 110.

An impurity region 121 containing the N-type impurities such as phosphorus (P) is formed at an upper end of the semiconductor layer 120. The impurity region 121 is connected to the bit line BL via a contact Ch and a contact Cb.

A lower end of the semiconductor layer 120 is connected to the P-type well region of the semiconductor substrate 100 via a semiconductor layer 122 made of single crystal silicon (Si) or the like. The semiconductor layer 122 functions as a channel region of the source-side select transistor STS. Outer peripheral surfaces of the semiconductor layers 122 are surrounded by the conductive layer 111 and face the conductive layer 111. An insulation layer 123 such as silicon oxide is provided between the semiconductor layer 122 and the conductive layer 111.

The gate insulating film 130 has a substantially cylindrical shape that covers the outer peripheral surface of the semiconductor layer 120. As shown in FIG. 6, the gate insulating film 130 includes, for example, a ferroelectric film 131 provided between the conductive layer 110 and the semiconductor layer 120, and an insulating film 132 provided between the ferroelectric film 131 and the semiconductor layer 120. The insulating film 132 is made of, for example, silicon oxide ($SiO_2$).

The ferroelectric film 131 may contain, for example, orthorhombic hafnium oxide. The hafnium oxide contained in the ferroelectric film 131 may be mainly orthorhombic crystals. More specifically, the hafnium oxide contained in the ferroelectric film 131 may be mainly formed of an orthorhombic crystal (e.g., orthorhombic III, space group Pbc21, space group number 29). Among the hafnium oxide crystals contained in the ferroelectric film 131, the orthorhombic crystals may occupy a largest proportion. The orthorhombic crystal is also referred to as a rhombic crystal.

The ferroelectric film 131 may contain at least one additive element selected from a group made of silicon (Si), zirconium (Zr), aluminum (Al), ytterbium (Y), strontium (Sr), lantern (La), samarium (Sm), gadolinium (Gd), terbium (Tb), dysprosium (Dy), holmium (Ho), elbium (Er), ytterbium (Yb), lutetium (Lu), and barium (Ba).

In view of exhibiting ferroelectricity in the hafnium oxide, a concentration of the additive element described above is preferably 0.1 atomic % or more and 60 atomic % or less. An appropriate range of the concentration of the additive element described above for exhibiting the ferroelectricity in the hafnium oxide varies depending on a type of the additive element. For example, when the additive element is silicon (Si), the appropriate range of the concentration of the additive element described above for exhibiting the ferroelectricity is 3 atomic % or more and 7 atomic % or less. For example, when the additive element is barium (Ba), the appropriate range of the concentration of the additive element described above for exhibiting the ferroelectricity is 0.1 atomic % or more and 3 atomic % or less. For example, when the additive element is zirconium (Zr), the appropriate range of the concentration of the additive element described above for exhibiting the ferroelectricity is 10 atomic % or more and 60 atomic % or less.

For example, as shown in FIG. 5, the conductive layer 140 extends along the Z direction and the X direction. The conductive layer 140 is connected to an N-type impurity region provided in the P-type well region of the semiconductor substrate 100. The conductive layer 140 may include, for example, a stacked film of a barrier conductive film made of titanium nitride (TiN) or the like and a metal film made of tungsten (W) or the like. The conductive layer 140 functions, for example, as a part of the source line SL (FIG. 2). An insulating layer 141 made of silicon oxide ($SiO_2$) or the like is provided on a side surface of the conductive layer 140 in the Y direction.

The conductive layer 150 is arranged along the X direction and extends along the Y direction. The conductive layer 150 may include, for example, a stacked film of a barrier conductive film made of titanium nitride (TiN) or the like and a metal film made of copper (Cu) or the like. The conductive layer 150 functions, for example, as a part of the bit line BL (FIG. 2).

Threshold Voltage of Memory Cell MC

Figure 7:
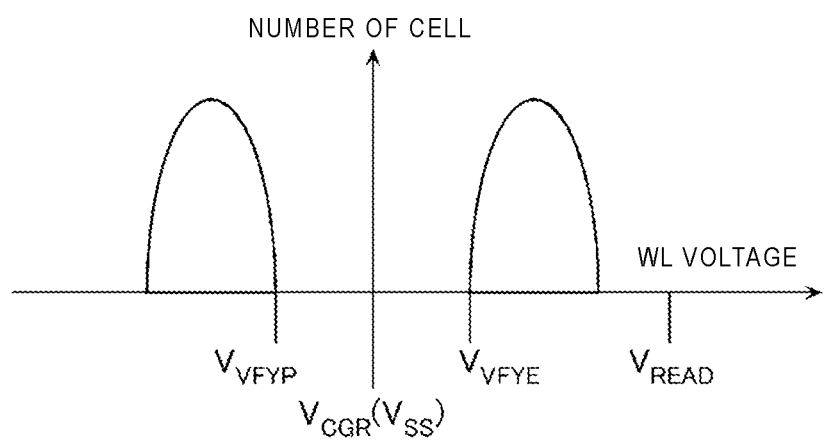
FIG. 7 is a schematic histogram illustrating a threshold voltage of a memory cell.

Next, the threshold voltage of the memory cell MC will be described with reference to FIG. 7. FIG. 7 is a schematic histogram illustrating the threshold voltage of the memory cell MC in which one bit of data is recorded. A horizontal axis indicates a voltage applied to the word line WL, and a vertical axis indicates the number of the memory cells MC.

In the example in FIG. 7, the threshold voltage is controlled to indicate two states of the memory cell MC. For example, a threshold voltage of the memory cell MC controlled to a lower state is smaller than a verification voltage $V_{VFYP}$ in FIG. 7. A threshold voltage of the memory cell MC controlled to an upper state is larger than a verification voltage $V_{VFYE}$ in FIG. 7.

During the read operation, for example, a read voltage $V_{CGR}$ that is larger than the verification voltage $V_{VFYP}$ and is smaller than the verification voltage $V_{VFYE}$ is applied to the selected word line WL. In the example in FIG. 7, the read voltage $V_{CGR}$ has a magnitude approximate to the ground voltage $V_{SS}$. Accordingly, the selected memory cell MC controlled to the lower state is in the ON state, and the selected memory cell MC controlled to the upper state is in the OFF state.

During the read operation, for example, a read pass voltage $V_{READ}$ that is larger than the threshold voltage of the memory cell MC controlled to the upper state is applied to a non-selected word line WL. Accordingly, a non-selected memory cell MC is in the ON state regardless of data to be recorded. Accordingly, the selected memory cell MC conducts with the bit line BL (FIG. 2) and the source line SL (FIG. 2). Therefore, by applying a voltage between the bit line BL and the source line SL in this state and detecting whether a current flows through the bit line BL, data recorded in the selected memory cell MC can be read.

Figure 8:
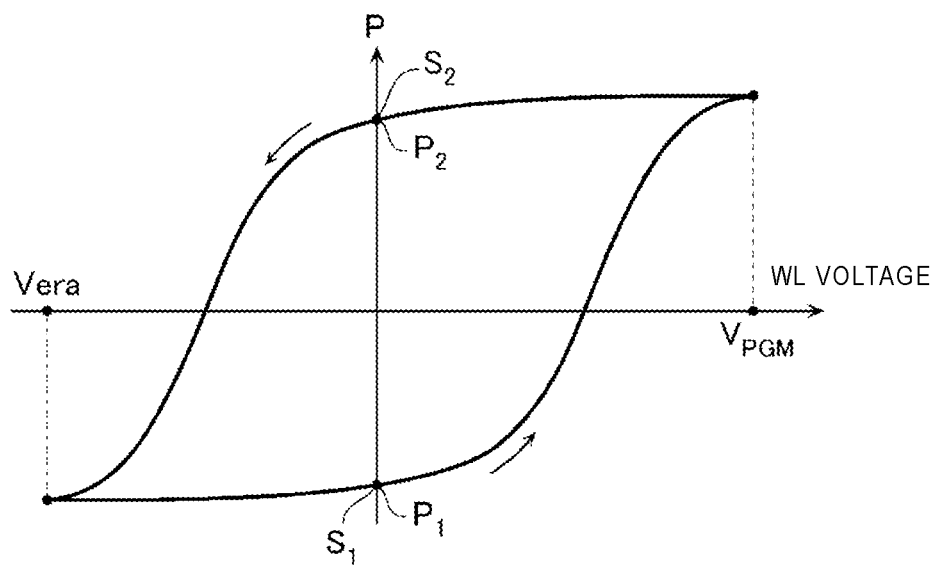
FIG. 8 is a schematic graph illustrating a polarizability of a memory cell.
Figure 9:
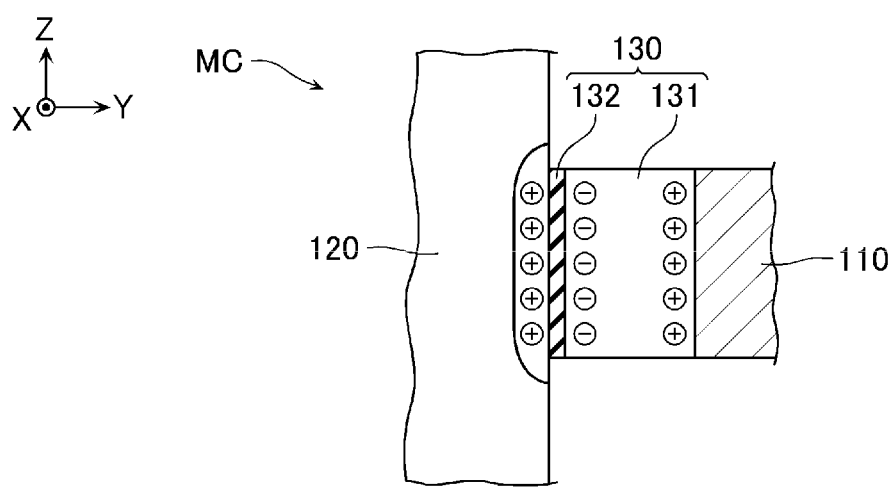
FIG. 9 is a schematic cross-sectional view illustrating a state of a memory cell.
Figure 10:
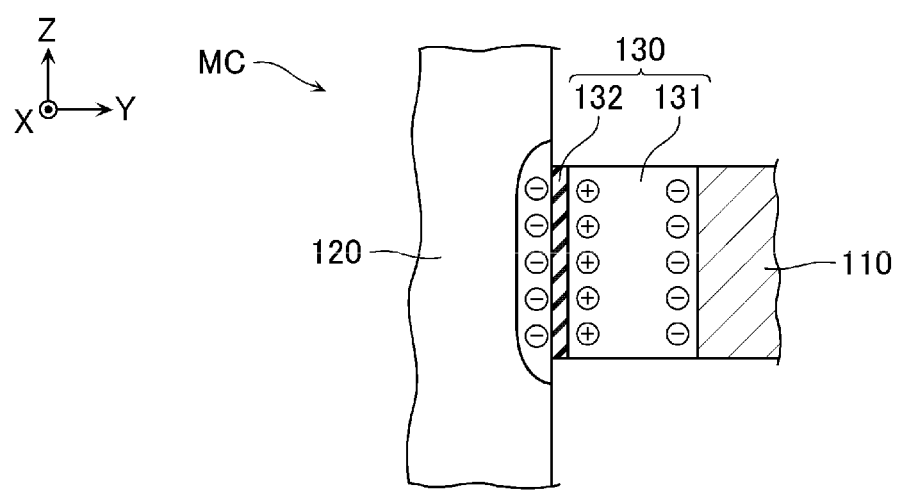
FIG. 10 is a schematic cross-sectional view illustrating a state of a memory cell.

Next, a method for controlling the threshold voltage of the memory cell MC will be described with reference to FIGS. 8 to 10. FIG. 8 is a schematic graph illustrating a polarizability of the memory cell MC. A horizontal axis of the graph shown in FIG. 8 indicates a voltage applied to the word line WL. A vertical axis of the graph shown in FIG. 8 indicates a polarizability P of the ferroelectric film 131. FIGS. 9 and 10 are schematic cross-sectional views illustrating states of the memory cell MC.

As described with reference to FIG. 6, the gate insulating film 130 of the memory cell MC includes the ferroelectric film 131. When a positive electrode voltage and a negative electrode voltage having a predetermined magnitude or more are alternately supplied to the word line WL connected to such a memory cell MC, a hysteresis curve as shown in FIG. 8 is observed. In FIG. 8, states $S_1$, $S_2$ are shown on this hysteresis curve.

The state $S_1$ is a state of the memory cell MC controlled to the upper state. The state $S_1$ is a state where the polarizability P is a negative polarizability $P_1$, and a voltage applied to the word line WL is the ground voltage $V_{SS}$. In this state, as shown in FIG. 9, negative charges are induced on the surface of the ferroelectric film 131 on the semiconductor layer 120 side. In this state, since positive charges are induced in the semiconductor layer 120, it is difficult for electron channels to be formed in the semiconductor layer 120. Therefore, the threshold voltage of the memory cell MC becomes a positive value.

When a voltage having a magnitude approximate to that of the read pass voltage is applied to the gate electrode of the memory cell MC in the state $S_1$, a state of polarization in the ferroelectric film 131 does not change. When the application of the voltage to the gate electrode is interrupted in this state, the memory cell MC returns to the state $S_1$.

When the positive electrode voltage having the predetermined magnitude or more is applied to the gate electrode of the memory cell MC in the state $S_1$, an electric field between the conductive layer 110 and the semiconductor layer 120 reverses a direction of the polarization in the ferroelectric film 131, and as shown in FIG. 8, the polarizability P in the ferroelectric film 131 increases. When the voltage applied to the gate electrode reaches a program voltage $V_{PGM}$, the polarizability P of the memory cell MC changes to a certain magnitude and becomes saturated. When the application of the voltage to the gate electrode is interrupted in this state, the memory cell MC transitions to the state $S_2$.

The state $S_2$ is a state of the memory cell MC controlled to the lower state. The state $S_2$ is a state where the polarizability P is a positive polarizability $P_2$, and a voltage applied to the word line WL is the ground voltage $V_{SS}$. In this state, as shown in FIG. 10, positive charges are induced on the surface of the ferroelectric film 131 on the semiconductor layer 120 side. In this state, negative charges are induced in the semiconductor layer 120. That is, an electron channel is formed in the semiconductor layer 120. Therefore, the threshold voltage of the memory cell MC becomes a negative value.

When the negative electrode voltage having the predetermined magnitude or more is applied to the gate electrode of the memory cell MC in the state $S_2$, an electric field between the conductive layer 110 and the semiconductor layer 120 reverses a direction of the polarization in the ferroelectric film 131, and as shown in FIG. 8, the polarizability P in the ferroelectric film 131 decreases. When the voltage applied to the gate electrode reaches an erase voltage $V_{era}$, the polarizability P of the memory cell MC changes to a certain magnitude and becomes saturated. When the application of the voltage to the gate electrode is interrupted in this state, the memory cell MC transitions to the state $S_1$.

Read Operation

Figure 11:
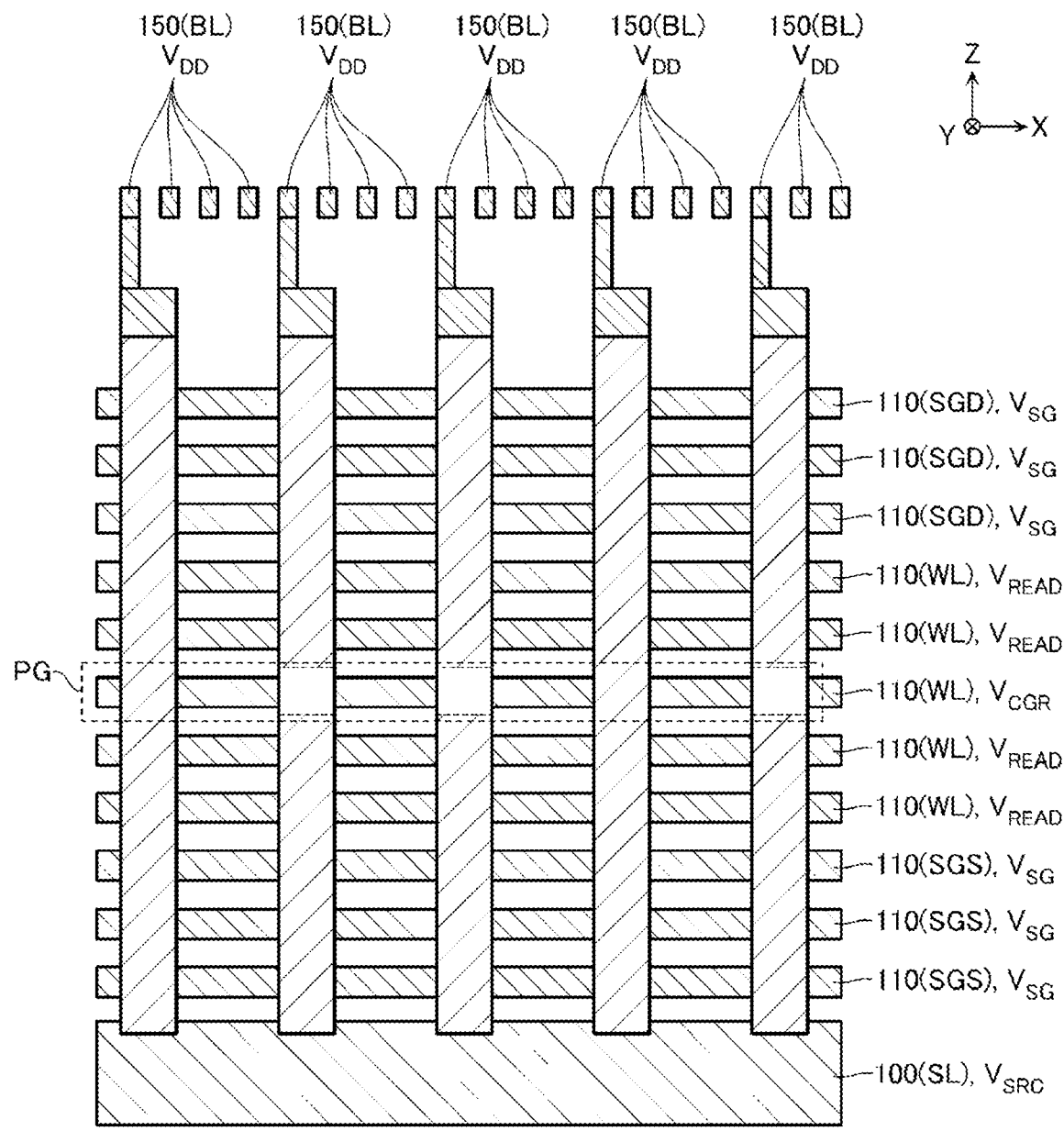
FIG. 11 is a schematic cross-sectional view illustrating aspects related to a read operation.

Next, a read operation of the semiconductor storage device will be more specifically described with reference to FIG. 11. FIG. 11 is a schematic cross-sectional view illustrating the read operation.

The read operation is collectively executed for all memory cells MC that are provided in one string unit SU and are connected to the selected word line WL. In the following description, all memory cells MC that are provided in one string unit SU and are connected to one word line WL may be referred to as a page PG.

During the read operation, for example, a voltage $V_{DD}$ is applied to the bit line BL, and a voltage $V_{SRC}$ is applied to the source line SL. The voltage $V_{SRC}$ has, for example, a magnitude approximate to that of the ground voltage $V_{SS}$. The voltage $V_{SRC}$ is, for example, larger than the ground voltage $V_{SS}$ and smaller than the voltage $V_{DD}$.

A plurality of memory cells MC connected to the selected word line WL are selectively brought into conduction with the bit line BL and the source line SL. For example, a voltage $V_{SG}$ is applied to the select gate lines (SGD, SGS), so that the select transistors (STD, STS) are in the ON state. The read pass voltage $V_{READ}$ is applied to the non-selected word line WL, and all the memory cells MC connected to the non-selected word line WL are in the ON state.

The read voltage $V_{CGR}$ is applied to the selected word line WL. Accordingly, the memory cells MC in the lower state are in the ON state, and the memory cells MC in the upper state are in the OFF state. In this state, a sense amplifier module in the peripheral circuit PC detects the ON state and the OFF state of the selected memory cell MC and outputs the state as read data to the controller die CD (FIG. 1). The controller die CD performs the bit error detection and correction on this data and then transfers the data to the host computer 20 (FIG. 1).

Write Sequence

Figure 12:
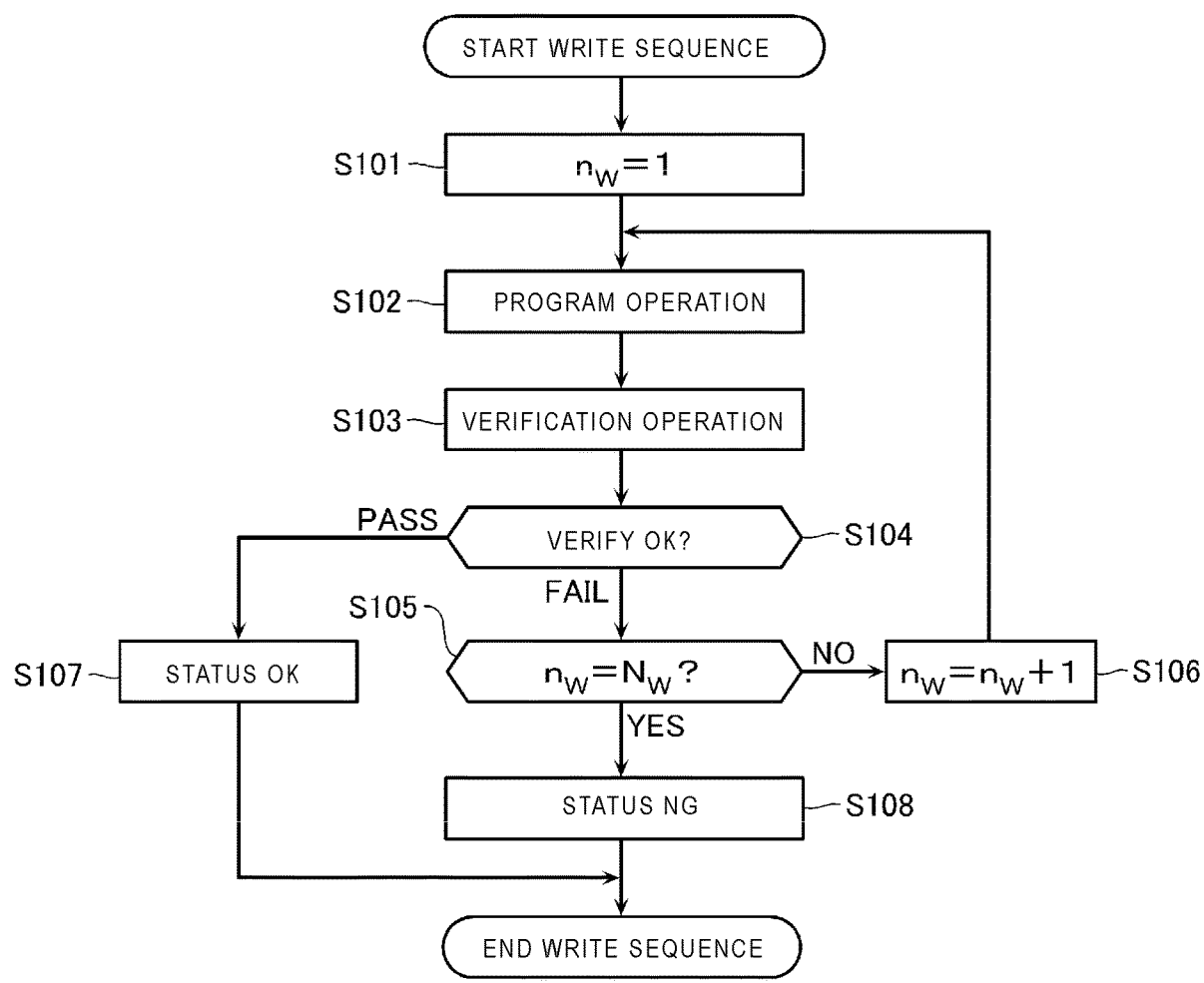
FIG. 12 is a schematic flowchart illustrating a write sequence.
Figure 13:
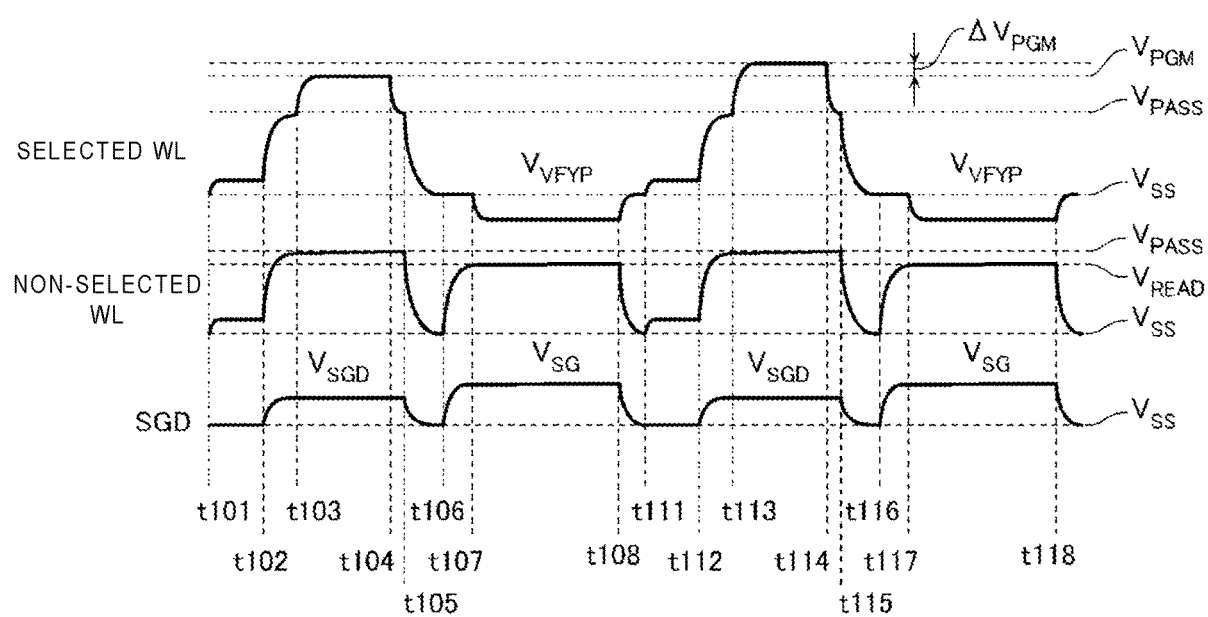
FIG. 13 is a schematic waveform diagram illustrating aspects of a write sequence.
Figure 14:
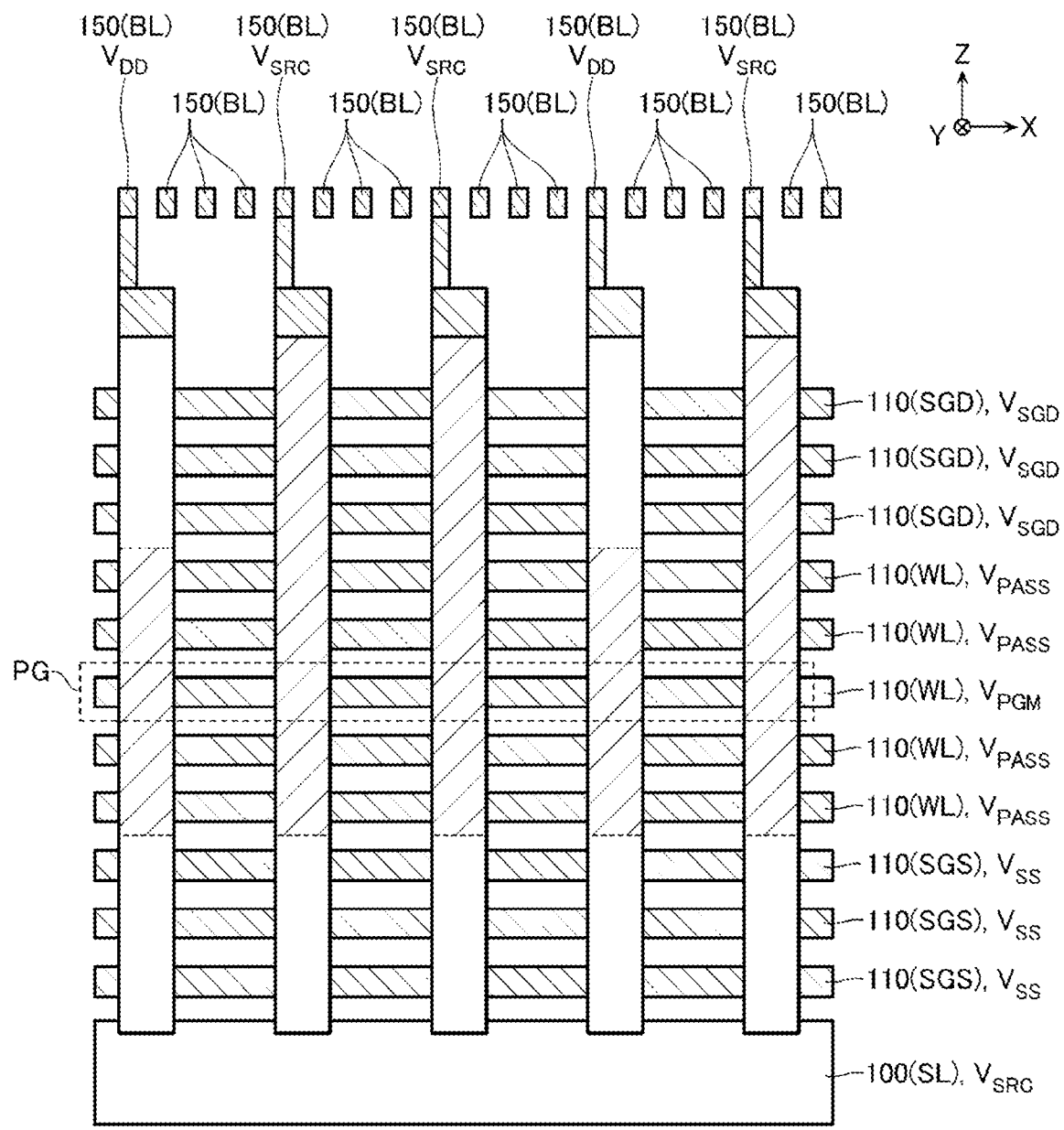
FIG. 14 is a schematic cross-sectional view illustrating aspects related to a write sequence.
Figure 15:
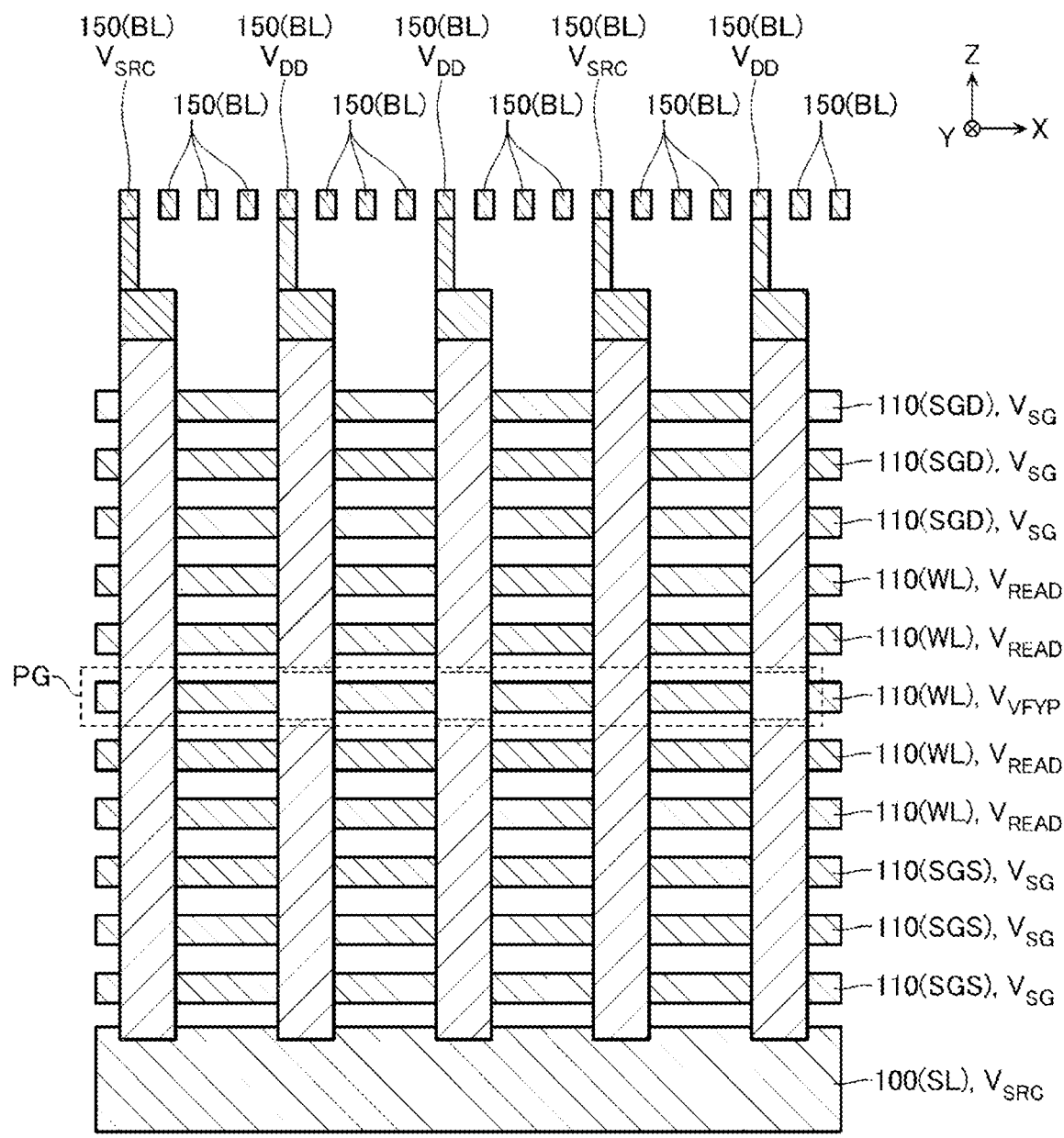
FIG. 15 is a schematic cross-sectional view illustrating aspects related to a write sequence.

Next, a write sequence will be described with reference to FIGS. 12 to 15. FIG. 12 is a schematic flowchart illustrating the write sequence. FIG. 13 is a schematic waveform diagram illustrating the write sequence. FIGS. 14 and 15 are schematic cross-sectional views illustrating the write sequence.

The write sequence is collectively executed for all the memory cells MC in one page PG.

In step S101 (FIG. 12), the number of loops $n_W$ is set to 1. The number of loops $n_W$ is recorded in a register or the like.

In step S102, a program operation is performed.

At a program operation timing t101 (FIG. 13), for example, as illustrated in FIG. 14, the voltage $V_{SRC}$ is applied to the bit lines BL connected to the memory cells MC of the plurality of selected memory cells MC, the threshold voltages of which are adjusted, and the voltage $V_{DD}$ is supplied to the bit lines BL connected to the memory cells MC of the plurality of selected memory cells MC, the threshold voltages of which are not adjusted.

At a program operation timing t102 (FIG. 13), for example, as illustrated in FIG. 14, the memory cells MC to be adjusted are selectively brought into conduction with the bit lines BL. For example, a voltage $V_{SGD}$ is applied to the drain-side select gate line SGD. The voltage $V_{SGD}$ is, for example, smaller than the voltage $V_{SG}$ in FIG. 11. Accordingly, the drain-side select transistors STD that is connected to the bit lines BL to which the voltage $V_{SRC}$ is applied are in the ON state, and the drain-side select transistors STD that is connected to the bit lines BL to which the voltage $V_{DD}$ is applied are in the OFF state. A write pass voltage $V_{PASS}$ is applied to the non-selected word lines WL. The write pass voltage $V_{PASS}$ is, for example, larger than the read pass voltage $V_{READ}$ in FIG. 11.

At a program operation timing t103 (FIG. 13), for example, as illustrated in FIG. 14, the program voltage $V_{PGM}$ is applied to the selected word line WL. The program voltage $V_{PGM}$ is larger than the write pass voltage $V_{PASS}$. Accordingly, it is possible to change a polarization state of the ferroelectric film 131 of the desired memory cell MC.

At a program operation timing t104 (FIG. 13), the write pass voltage $V_{PASS}$ is applied to the selected word lines WL.

At a program operation timing t105 (FIG. 13), the ground voltage $V_{SS}$ is applied to the selected word lines WL, the non-selected word lines WL, and the selected gate lines (SGD, SGS).

In step S103 (FIG. 12), a verification operation is performed.

At a verification operation timing t106 (FIG. 13), for example, as illustrated in FIG. 15, the read pass voltage $V_{READ}$ is applied to the non-selected word lines WL, and the voltage $V_{SG}$ is applied to the selected gate lines (SGD, SGS).

At a verification operation timing t107 (FIG. 13), for example, as illustrated in FIG. 15, the verification voltage $V_{VFYP}$ is applied to the selected word line WL. The ON state and the OFF state of the selected memory cells MC are detected.

At a verification operation timing t108 (FIG. 13), the ground voltage $V_{SS}$ is applied to the selected word lines WL, the non-selected word lines WL, and the selected gate lines (SGD, SGS).

In step S104 (FIG. 12), a result of the verification operation is determined. For example, when a certain number or more of the memory cells MC in the OFF state are detected in the verification operation, verify FAIL is determined, and the process proceeds to step S105. On the other hand, when the certain number or more of the memory cells MC in the OFF state are not detected in the verification operation, verify PASS is determined, and the process proceeds to step S107.

In step S105, it is determined whether the number of loops $n_W$ reaches a predetermined number of times $N_W$. When it is determined that the number of loops $n_W$ does not reach the predetermined number of times $N_W$, the process proceeds to step S106. When it is determined that the number of loops $n_W$ reaches the predetermined number of times $N_W$, the process proceeds to step S108.

In step S106, 1 is added to the number of loops $n_W$, and the process proceeds to step S102. In step S106, for example, a predetermined voltage $\Delta V$ is added to the program voltage $V_{PGM}$. Therefore, when the number of loops $n_W$ is 2 or more, in the program operation in step S102, a voltage larger than the program voltage $V_{PGM}$ is applied to the selected word lines WL.

In step S107, status data indicating that the write sequence is normally completed is stored in a status register and is output to the controller die CD (FIG. 1), and the write sequence is completed.

In step S108, status data indicating that the write sequence is not normally completed is stored in the status register and is output to the controller die CD (FIG. 1), and the write sequence is completed.

Erasing Sequence

Figure 16:
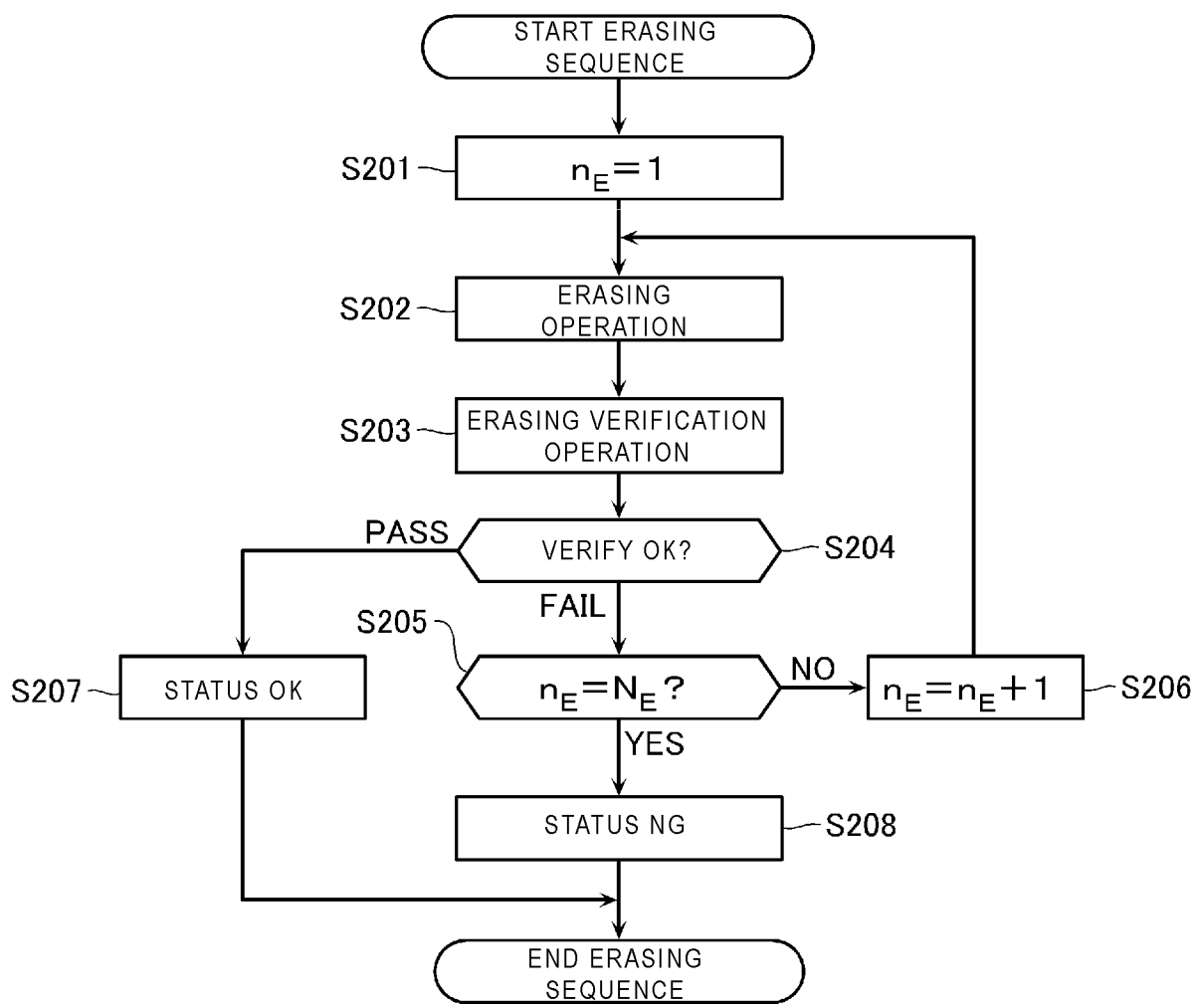
FIG. 16 is a schematic flowchart illustrating an erasing sequence.
Figure 17:
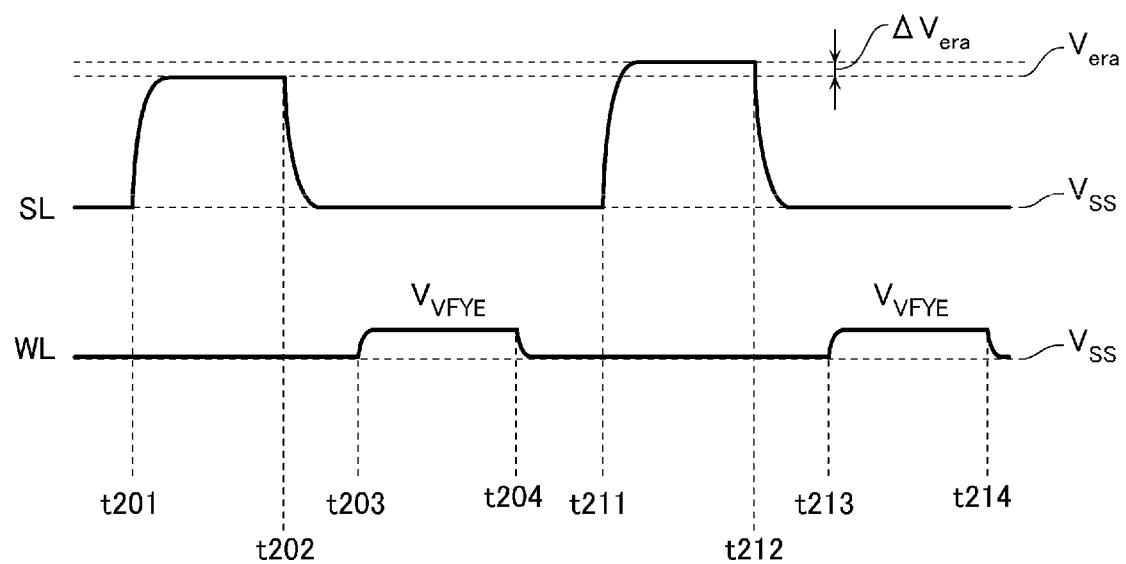
FIG. 17 is a schematic waveform diagram illustrating aspects of an erasing sequence.
Figure 18:
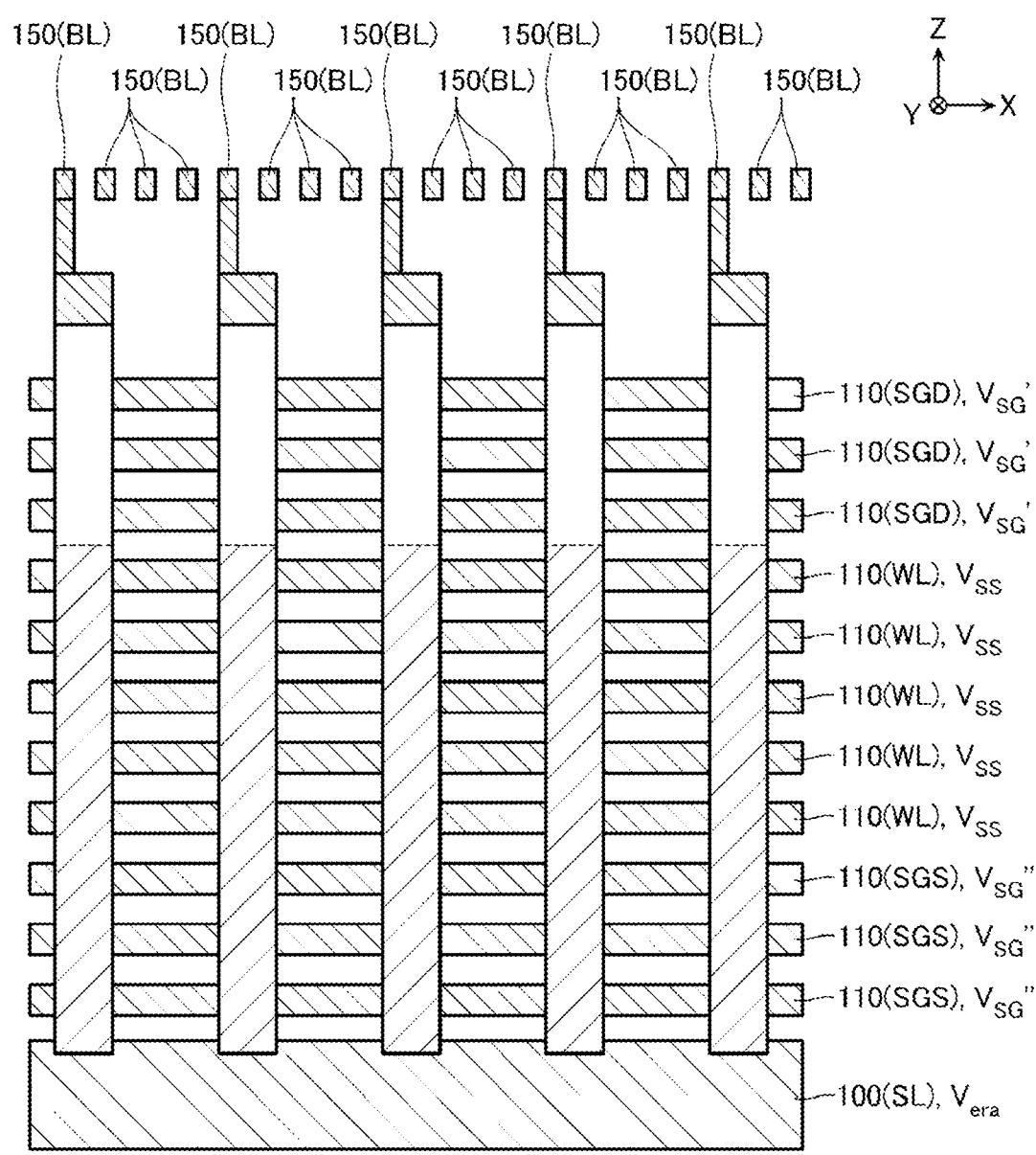
FIG. 18 is a schematic cross-sectional view illustrating aspects related to an erasing sequence.
Figure 19:
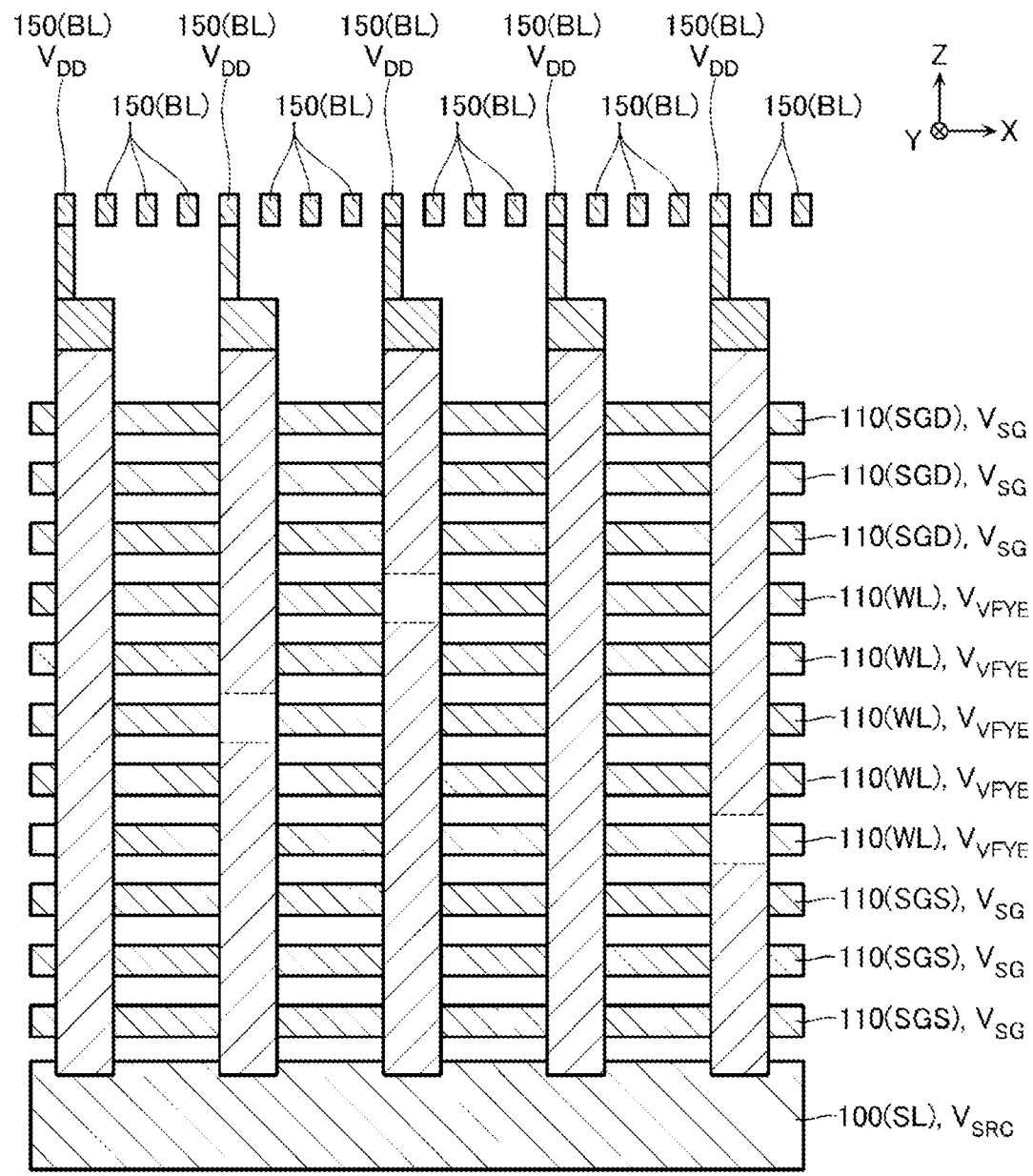
FIG. 19 is a schematic cross-sectional view illustrating aspects related to an erasing sequence.

Next, an erasing sequence will be described with reference to FIGS. 16 to 19. FIG. 16 is a schematic flowchart illustrating the erasing sequence. FIG. 17 is a schematic waveform diagram illustrating the erasing sequence. FIGS. 18 and 19 are schematic cross-sectional views illustrating the erasing sequence.

The erasing sequence is collectively executed for all the memory cells MC in one memory block BLK.

In step S201 (FIG. 12), the number of loops $n_E$ is set to 1. The number of loops $n_E$ is recorded in the register or the like.

In step S202, an erasing operation is performed.

At an erasing operation timing t201 (FIG. 17), for example, as illustrated in FIG. 18, the memory cells MC are separated from the bit lines BL and are brought into conduction with the source line SL. For example, a voltage $V_{SG}'$ is applied to the drain-side select gate lines SGD. The voltage $V_{SG}'$ is, for example, a voltage having a magnitude enough to make the drain-side select transistor STD in the OFF state. A voltage $V_{SG}''$ is applied to the source-side select gate line SGS. The voltage $V_{SG}''$ is, for example, a voltage having a magnitude enough to form an electron hole channel in the channel region of the source-side select transistor STS.

At the erasing operation timing t201 (FIG. 17), for example, as illustrated in FIG. 18, the ground voltage $V_{SS}$ is applied to the word lines WL, and the erase voltage $V_{era}$ is applied to the source line SL. Accordingly, it is possible to change the polarization state of the ferroelectric film 131 of the memory cell MC.

At an erasing operation timing t202 (FIG. 17), the ground voltage $V_{SS}$ is applied to the source lines SL and the selected gate lines (SGD, SGS).

In step S203 (FIG. 16), an erasing verification operation is performed.

At an erasing verification operation timing t203 (FIG. 17), for example, as illustrated in FIG. 19, the verification voltage $V_{VFYE}$ is applied to the word lines WL, and the voltage $V_{SG}$ is applied to the selected gate lines (SGD, SGS). The ON state and the OFF state of the memory cells MC are detected.

At a verification operation timing t204 (FIG. 17), the ground voltage $V_{SS}$ is applied to the word lines WL and the selected gate lines (SGD, SGS).

In step S204 (FIG. 16), a result of the erasing verification operation is determined. For example, when a certain number or more of the memory cells MC in the ON state are detected in the erasing verification operation, verify FAIL is determined, and the process proceeds to step S205. On the other hand, when the certain number or more of the memory cells MC in the ON state are not detected in the verification operation, verify PASS is determined, and the process proceeds to step S207.

In step S205, it is determined whether the number of loops $n_E$ reaches a predetermined number of times $N_E$. When it is determined that the number of loops $n_E$ does not reach the predetermined number of times $N_E$, the process proceeds to step S206. When it is determined that the number of loops $n_E$ reaches the predetermined number of times $N_E$, the process proceeds to step S208.

In step S206, 1 is added to the number of loops $n_E$, and the process proceeds to step S202. In step S206, for example, a predetermined voltage ΔV is added to the erase voltage $V_{era}$. Therefore, when the number of loops $n_E$ is 2 or more, in the erasing operation in step S202, a voltage larger than the erase voltage $V_{era}$ is applied to the source line SL.

In step S207, status data indicating that the erasing sequence is normally completed is stored in the status register and is output to the controller die CD (FIG. 1), and the erasing sequence is completed.

In step S208, status data indicating that the erasing sequence is not normally completed is stored in the status register and is output to the controller die CD (FIG. 1), and the erasing sequence is completed.

Characteristic Change of Ferroelectric Film 131

When the write sequence is executed for the memory cells MC, electrons in the semiconductor layer 120 may tunnel to the ferroelectric film 131 via the insulating film 132 and may be accumulated in the ferroelectric film 131 or the like. When the erasing sequence is executed for the memory cells MC, electron holes in the semiconductor layer 120 may tunnel to the ferroelectric film 131 via the insulating film 132 and may be accumulated in the ferroelectric film 131 or the like.

Figure 20:
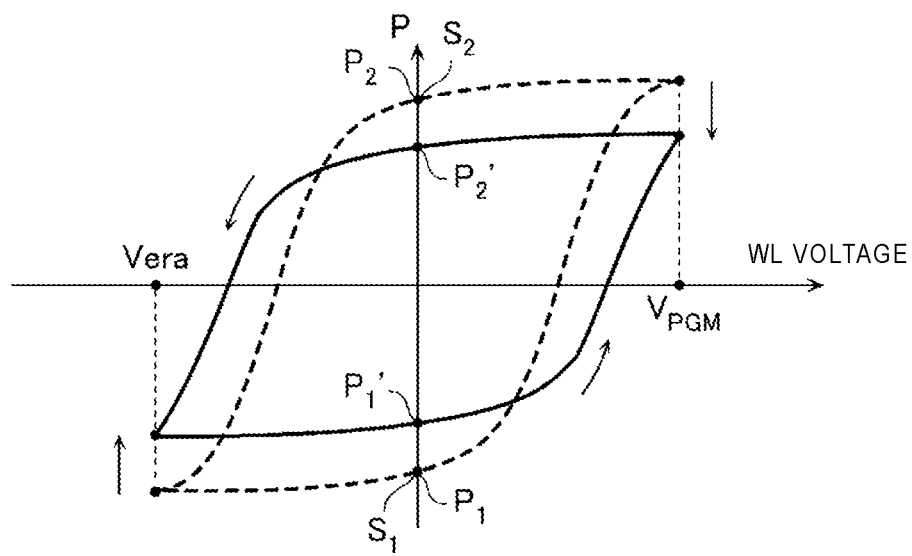
FIG. 20 is a schematic graph illustrating a characteristic change of a memory cell.

When the electrons or the electron holes are accumulated in the ferroelectric film 131 or the like, a polarization reversal may be difficult to occur due to influences of the electrons or the electron holes. For example, as shown in FIG. 20, even when the program voltage $V_{PGM}$ is applied to the selected word lines WL in the write sequence, the polarizability of the ferroelectric film 131 may increase only up to a polarizability $P_2'$ which is smaller than $P_2$. For example, as shown in FIG. 20, even when the erase voltage $V_{era}$ is applied to the source line SL in the erasing sequence, the polarizability of the ferroelectric film 131 may reduce only to a polarizability $P_1'$ which is larger than $P_1$.

Figure 21:
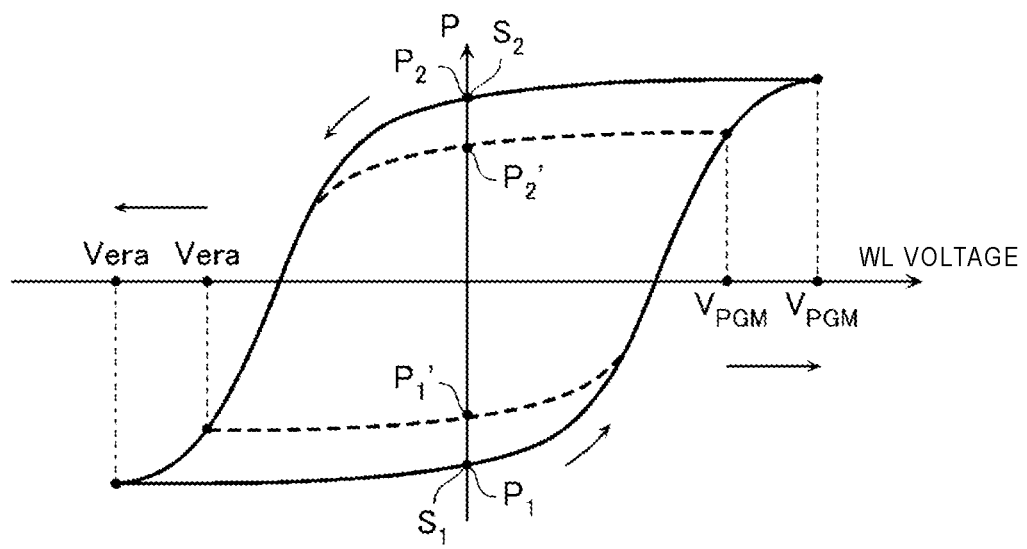
FIG. 21 is a schematic graph illustrating aspects related to a method for adjusting control parameters according to a first embodiment.

Therefore, in one embodiment, control parameters of the semiconductor storage device are updated as the number of times of write and erase increases. For example, at least one of the magnitude and an application time of the program voltage $V_{PGM}$ is increased. For example, at least one of the magnitude and an application time of the erase voltage $V_{era}$ is increased. Accordingly, for example, as shown in FIG. 21, the threshold voltage of the memory cell MC can be appropriately controlled by canceling out the influences of the electrons or the electron holes accumulated in the ferroelectric film 131 or the like.

Hereinafter, operations of the semiconductor storage device will be more specifically described.

Condition for Updating Control Parameter

Conditions for updating the control parameters can be adjusted as appropriate. For example, it is possible to monitor whether the number of times of write and erase to the memory cells MC or the like reaches a predetermined number, and update the control parameters when the number of times of write and erase reaches the predetermined number.

Update Range of Control Parameter

A range in which the control parameters are updated can be adjusted as appropriate. For example, the control parameters may be updated in the entire memory system 10 (FIG. 1). The control parameters may be updated for each memory die MD (FIG. 1). The control parameters may be updated for each memory cell array region $R_{MCA}$ (FIG. 4). The control parameters may be updated for each memory block BLK (FIG. 2). The control parameters may be updated for each string unit SU (FIG. 2). The control parameters may be updated for each page PG.

Figure 22:
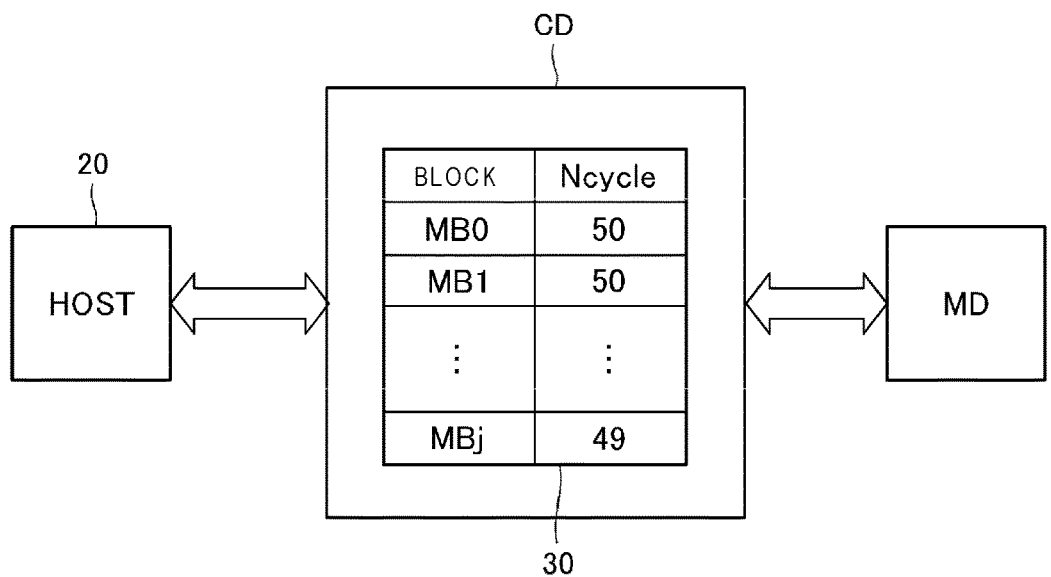
FIG. 22 is a schematic block diagram illustrating a method for adjusting control parameters according to a first embodiment.

For example, as shown in FIG. 22, the controller die CD may store a table 30 for monitoring the number of times of write and erase for each memory block BLK. This table 30 is used, for example, for an operation for equalizing the number of times of write and erase between the memory blocks BLK. Such an operation is generally referred to as wear leveling. Here, when the control parameters are updated for each memory block BLK, this table 30 can be used.

Update Timing of Control Parameter

Figure 23:
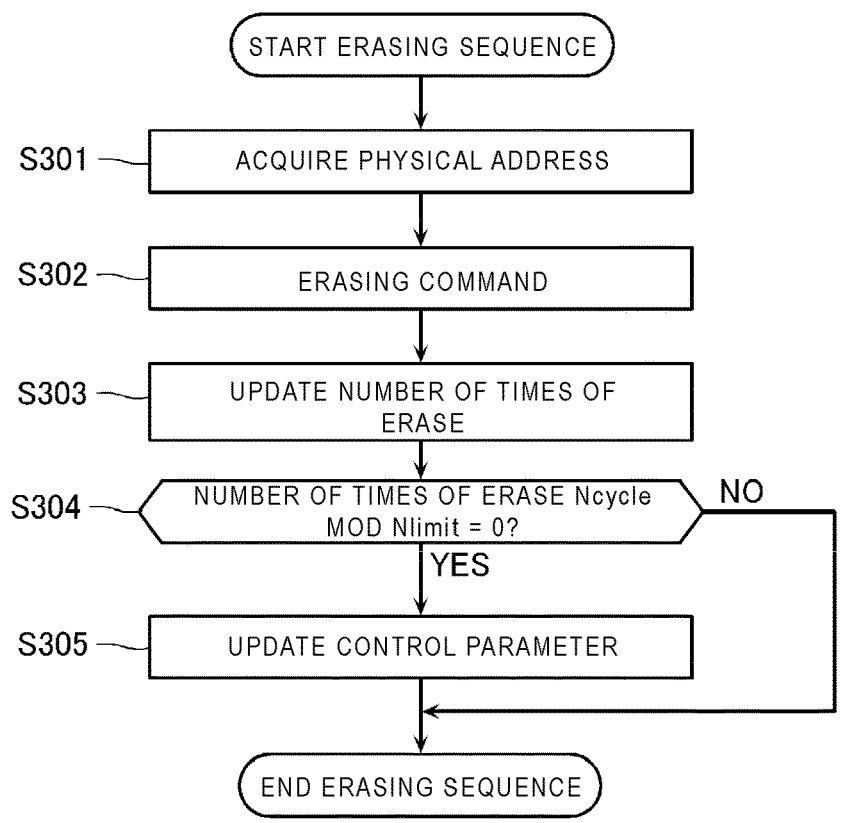
FIG. 23 is a schematic flowchart illustrating a method for adjusting control parameters according to a first embodiment.

A timing at which the control parameters are updated can be adjusted as appropriate. FIG. 23 illustrates operations for updating the control parameters after the erasing sequence is executed.

For example, in step S301 in FIG. 23, the controller die CD acquires a physical address of the memory block BLK on which the erasing sequence is executed. In step S302, a command set indicating executing the erasing sequence is input to the memory die MD. In step S303, the table 30 illustrated in FIG. 22 is accessed to update the number of times of erase Ncycle. In step S304, it is determined whether the number of times of erase Ncycle is an integral multiple of a predetermined number Nlimit, when the Ncycle is an integral multiple of the Nlimit, the process proceeds to step S305, and when the Ncycle is not an integral multiple of the Nlimit, the process is ended. In step S305, a command set indicating updating the control parameters is input to the memory die MD.

Type of Control Parameter

As the control parameter, only the magnitude or only the application time of the program voltage $V_{PGM}$ may be increased, or both the magnitude and the application time of the program voltage $V_{PGM}$ may be increased. Only the magnitude or only the application time of the erase voltage $V_{era}$ may be increased, or both the magnitude and the application time of the erase voltage $V_{era}$ may be increased.

Figure 24:
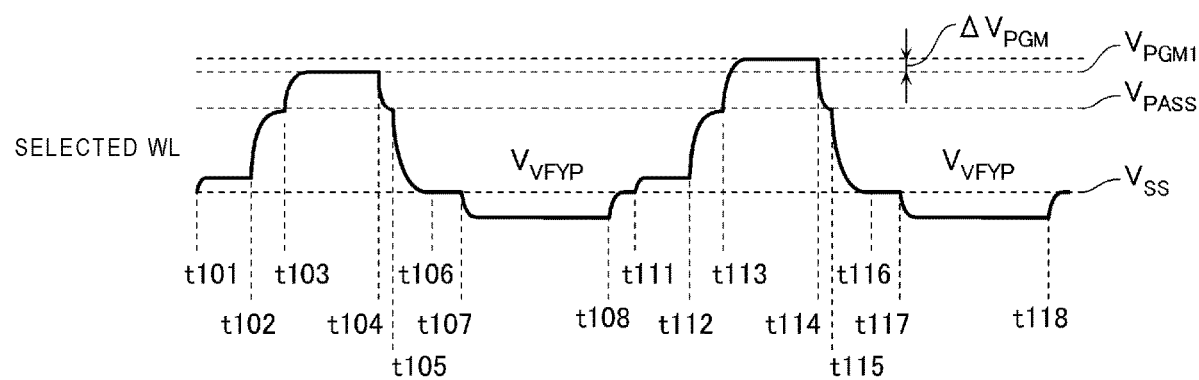
FIG. 24 through FIG. 35 are schematic waveform diagrams each illustrating aspects related to a method for adjusting control parameters according to a first embodiment.
Figure 25:
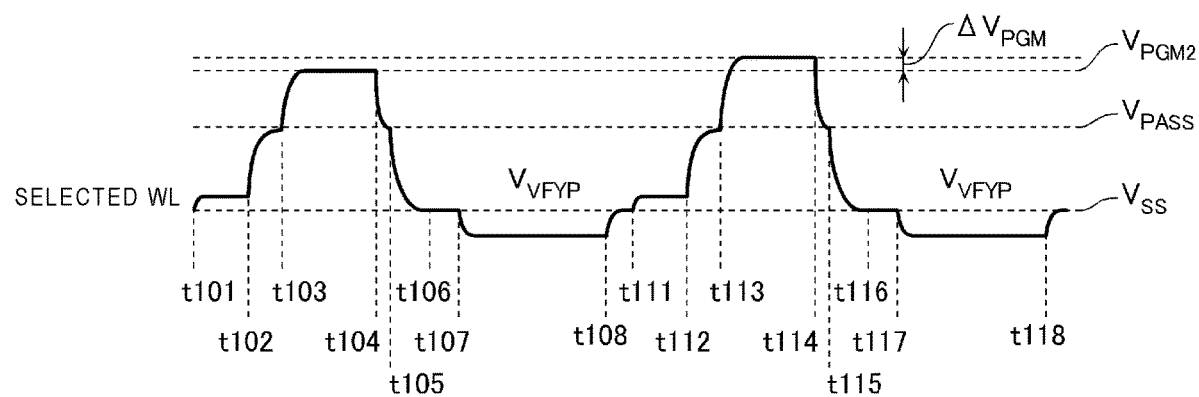
Figure 26:
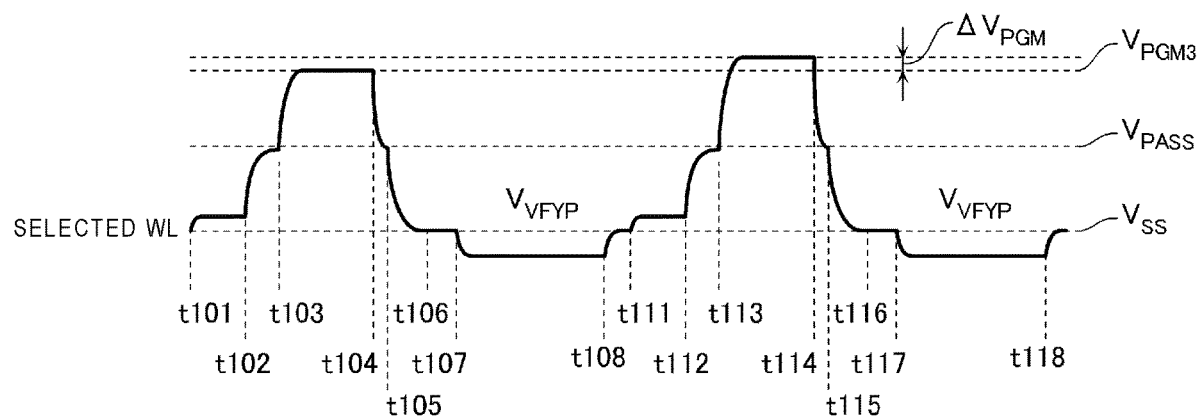

For example, FIGS. 24 to 26 show examples of increasing the magnitudes of the program voltage $V_{PGM}$ as the control parameter. For example, FIG. 24 illustrates the program voltage $V_{PGM}$ when the number of times of write and erase is less than a first number of times as a program voltage $V_{PGM1}$. FIG. 25 illustrates the program voltage $V_{PGM}$ when the number of times of write and erase is equal to or more than the first number of times and less than a second number of times as a program voltage $V_{PGM2}$. FIG. 26 illustrates the program voltage $V_{PGM}$ when the number of times of write and erase is equal to or more than the second number of times as a program voltage $V_{PGM3}$. The program voltage $V_{PGM2}$ is larger than the program voltage $V_{PGM1}$. The program voltage $V_{PGM3}$ is larger than the program voltage $V_{PGM2}$.

Figure 27:
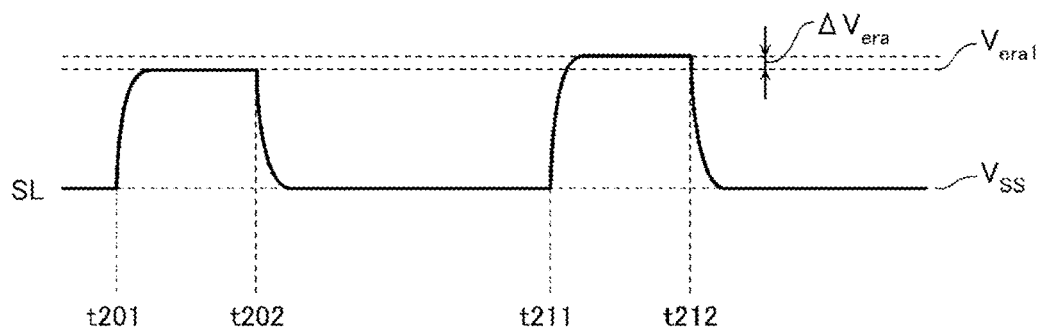
Figure 28:
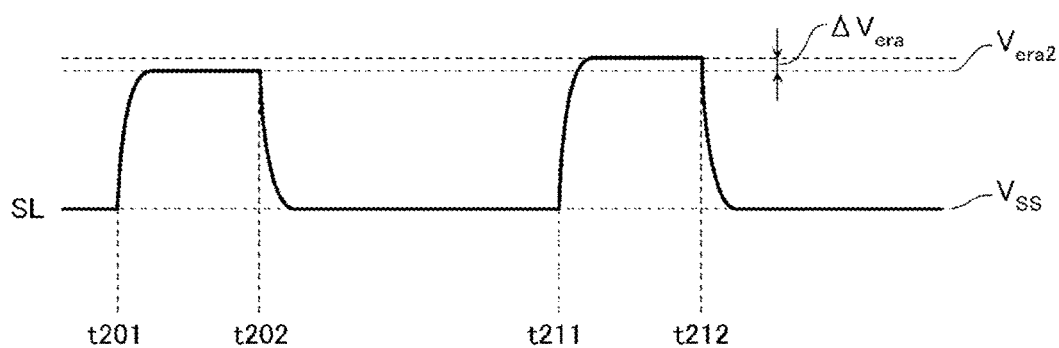
Figure 29:
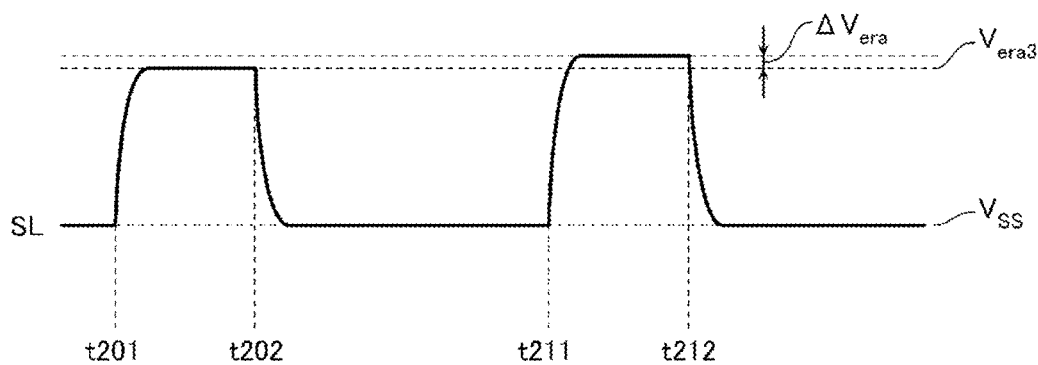

For example, FIGS. 27 to 29 show examples of increasing the magnitudes of the erase voltage $V_{era}$ as the control parameter. For example, FIG. 27 illustrates the erase voltage $V_{era}$ when the number of times of write and erase is less than the first number of times as an erase voltage $V_{era1}$. FIG. 28 illustrates the erase voltage $V_{era}$ when the number of times of write and erase is equal to or more than the first number of times and less than the second number of times as an erase voltage $V_{era2}$. FIG. 29 illustrates the erase voltage $V_{era}$ when the number of times is equal to or more than the second number of times as an erase voltage $V_{era3}$. The erase voltage $V_{era2}$ is larger than the erase voltage $V_{era1}$. The erase voltage $V_{era3}$ is larger than the erase voltage $V_{era2}$.

Figure 30:
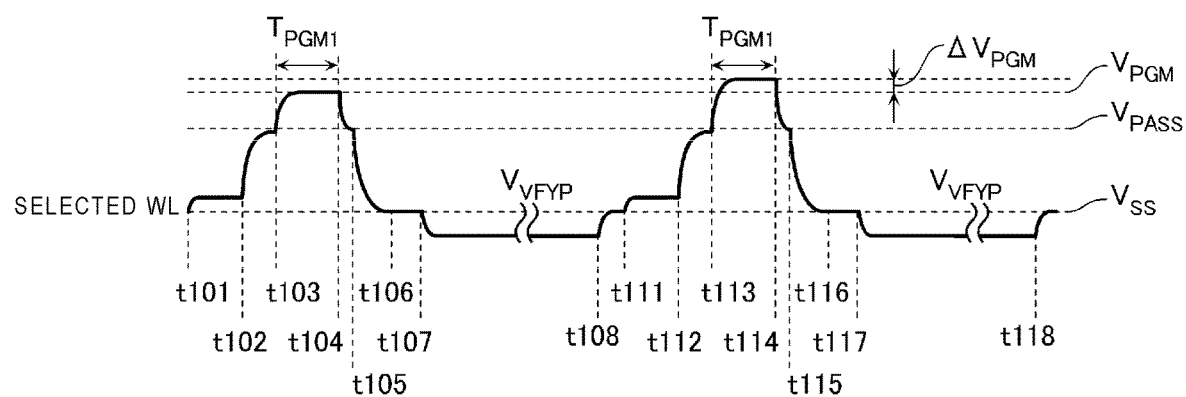
Figure 31:
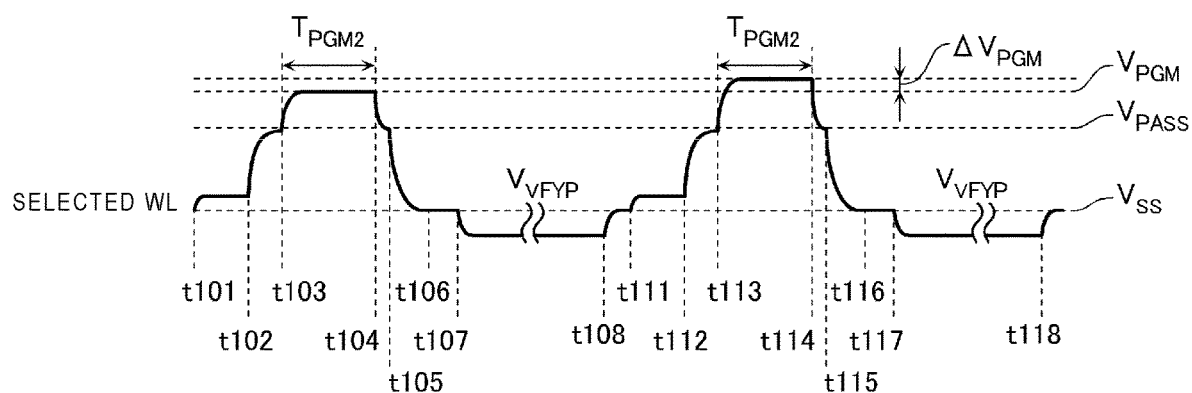
Figure 32:
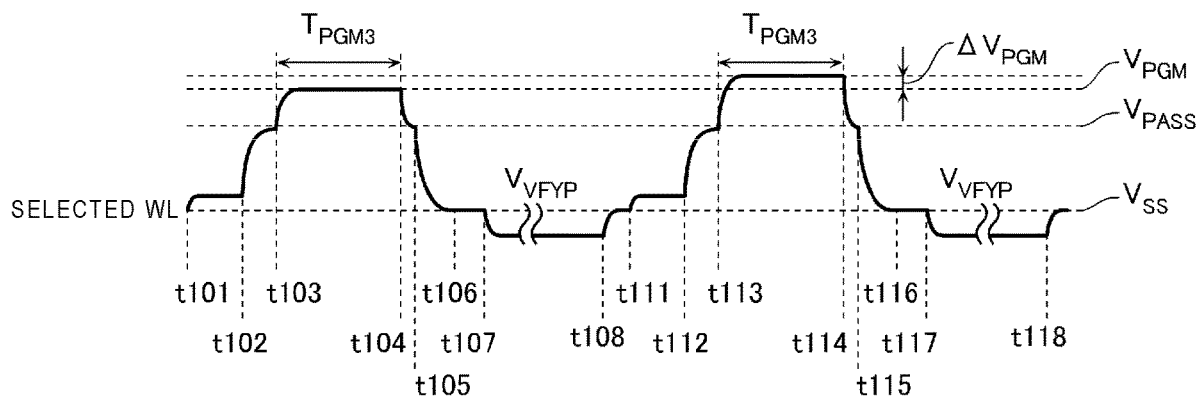

For example, FIGS. 30 to 32 show examples of increasing an application time of the program voltage $V_{PGM}$ as the control parameter. For example, FIG. 30 illustrates an application time of the program voltage $V_{PGM}$ when the number of times of write and erase is less than the first number of times as a time $T_{PGM1}$. FIG. 31 illustrates an application time of the program voltage $V_{PGM}$ when the number of times is equal to or more than the first number of times and less than the second number of times as a time $T_{PGM2}$. FIG. 32 illustrates an application time of the program voltage $V_{PGM}$ when the number of times of write and erase is equal to or more than the second number of times as a time $T_{PGM3}$. The time $T_{PGM2}$ is longer than the time $T_{PGM1}$. The time $T_{PGM3}$ is longer than the time $T_{PGM2}$.

Figure 33:
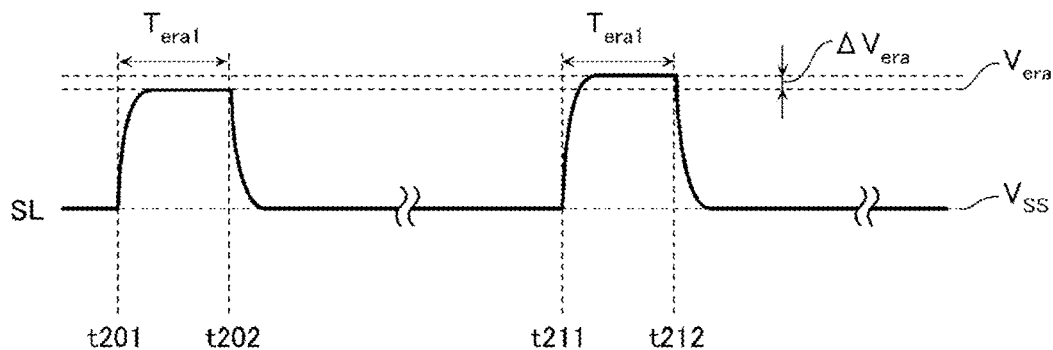
Figure 34:
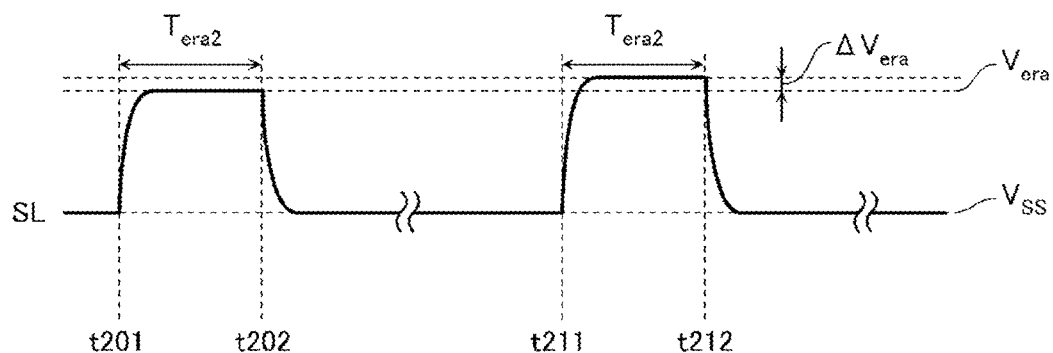
Figure 35:
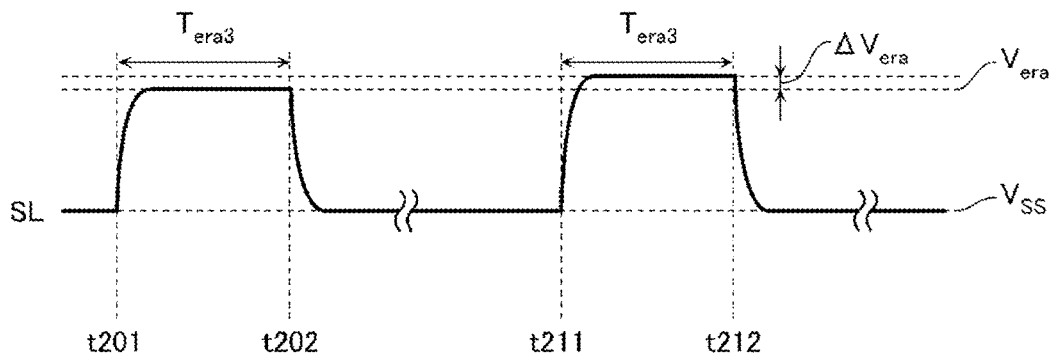

For example, FIGS. 33 to 35 show examples of increasing an application time of the erase voltage $V_{era}$ as the control parameter. For example, FIG. 33 illustrates an application time of the erase voltage $V_{era}$ when the number of times of write and erase is less than the first number of times as a time $T_{era1}$. FIG. 34 illustrates an application time of the erase voltage $V_{era}$ when the number of times of write and erase is equal to or more than the first number of times and less than the second number of times as a time $T_{era2}$. FIG. 35 illustrates an application time of the erase voltage $V_{era}$ when the number of times of write and erase is equal to or more than the second number of times as a time $T_{era3}$. The time $T_{era2}$ is longer than the time $T_{era1}$. The time $T_{era3}$ is longer than the time $T_{era2}$.

Magnitudes and application times of the voltages other than the program voltage $V_{PGM}$ and the erase voltage $V_{era}$, for example, the read voltage $V_{CGR}$, the verification voltage $V_{VFYP}$, $V_{VFYE}$, the read pass voltage $V_{READ}$, the write pass voltage $V_{PASS}$, and the like (hereinafter, may be referred to as "the read voltage $V_{CGR}$ and the like") may have a constant magnitude regardless of the number of times of write and erase. The term "constant" as used herein may mean, for example, constant within a range of one or two significant digits. For example, when the magnitude and the application time of at least one of the program voltage $V_{PGM}$ and the erase voltage $V_{era}$ are adjusted according to the command set received from the controller die CD, it may mean that the command set indicating adjusting the magnitude and the application time of the read voltage $V_{CGR}$ and the like is not received from the controller die CD.

Second Embodiment

Next, a semiconductor storage device according to a second embodiment will be described with reference to FIGS. 36 to 38.

As described with reference to FIG. 7 and the like, in the semiconductor storage device according to a first embodiment, the threshold voltage of the memory cell MC is controlled so that one bit of data is recorded in the memory cell MC. However, such a method is merely an example, and a specific method can be appropriately adjusted. For example, by controlling the threshold voltage of the memory cell MC so that the memory cell MC are in $2^n$ (n is a natural number) states, n bits of data can be recorded in the memory cell MC.

Figure 36:
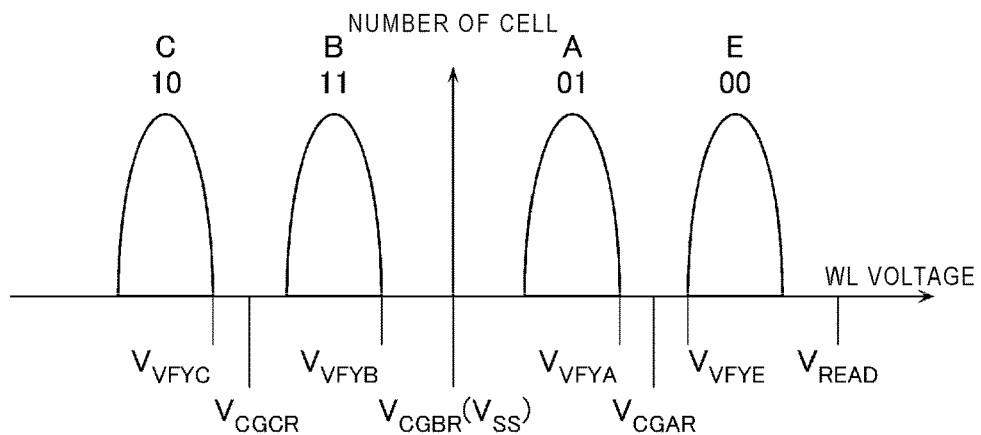
FIG. 36 is a schematic histogram illustrating a threshold voltage of memory cells according to a second embodiment.

For example, FIG. 36 shows an example of recording two bits of data in the memory cell MC by controlling the threshold voltage of the memory cell MC in four states. In the illustrated example, a threshold voltage of the memory cell MC controlled to a C state is smaller than a verification voltage $V_{VFYC}$. A threshold voltage of the memory cell MC controlled to a B state is larger than the threshold voltage of the memory cell MC controlled to the C state and smaller than a verification voltage $V_{VFYB}$. A threshold voltage of the memory cell MC controlled to an A state is larger than the threshold voltage of the memory cell MC controlled to the B state and smaller than a verification voltage $V_{VFYA}$. A threshold voltage of the memory cell MC controlled to an E state is larger than a verification voltage $V_{VFYE}$ and smaller than the read pass voltage $V_{READ}$.

During the read operation, for example, read voltages $V_{CGCR}$, $V_{CGBR}$, $V_{CGAR}$ are applied to the selected word lines WL. The read voltage $V_{CGCR}$ is larger than the threshold voltage of the memory cell MC in the C state and smaller than the threshold voltage of the memory cell MC in the B state. The read voltage $V_{CGBR}$ is larger than the threshold voltage of the memory cell MC in the B state and smaller than the threshold voltage of the memory cell MC in the A state. The read voltage $V_{CGAR}$ is larger than the threshold voltage of the memory cell MC in the A state and smaller than the threshold voltage of the memory cell MC in the E state.

For example, in the example in FIG. 36, "10", "11", "01", and "00" are assigned to the memory cells MC in the C state, the B state, the A state, and the E state, respectively. In such a case, during reading a high-order bit, data recorded in the memory cell MC can be read by applying the read voltage $V_{CGBR}$ to the selected word lines WL and executing the read operation. During reading a low-order bit, the data recorded in the memory cell MC can be read by applying the read voltage $V_{CGCR}$ to the selected word lines WL and executing the read operation, applying the read voltage $V_{CGAR}$ to the selected word lines WL and executing the read operation, and calculating an exclusive OR of the data acquired by executing these read operations.

Next, a method of controlling the threshold voltage of the memory cell MC will be described with reference to FIG. 37. FIG. 37 is a schematic graph illustrating a polarizability of the memory cell MC. A horizontal axis of the graph shown in FIG. 37 indicates a voltage applied to the word line WL. A vertical axis of the graph shown in FIG. 37 indicates a polarizability P of the ferroelectric film 131.

Figure 37:
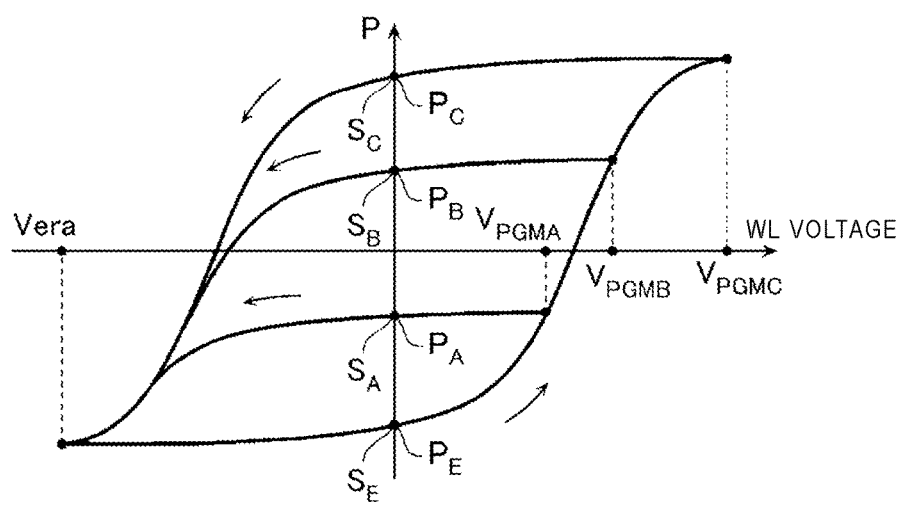
FIG. 37 is a schematic graph illustrating a polarizability of a memory cell.
Figure 38:
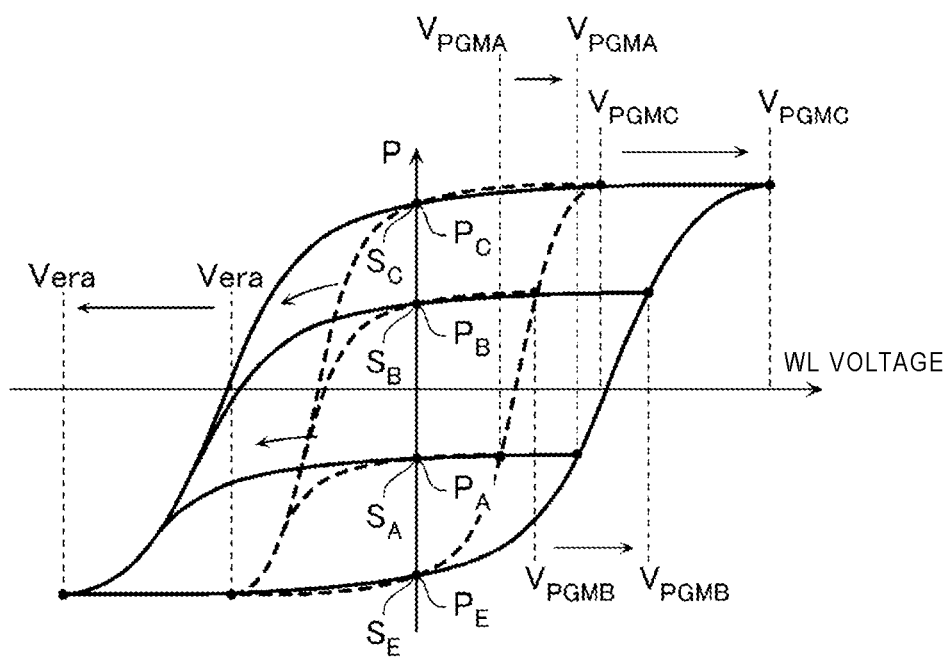
FIG. 38 is a schematic graph illustrating aspects related to a method for adjusting control parameters according to a second embodiment.

FIG. 37 shows states $S_E$, $S_A$, $S_B$, $S_C$ on hysteresis curves showing characteristics of the ferroelectric film 131.

The state $S_E$ is a state of the memory cell MC in the E state. The state $S_E$ is a state where the polarizability P is a negative polarizability $P_E$ and a voltage applied to the word line WL is the ground voltage $V_{SS}$. The state $S_E$ is the same as the state $S_1$ described with reference to FIGS. 8 and 9.

When the positive electrode voltage having the predetermined magnitude or more is applied to the gate electrode of the memory cell MC in the state $S_E$, an electric field between the conductive layer 110 and the semiconductor layer 120 reverses a direction of the polarization in the ferroelectric film 131, and as shown in FIG. 37, the polarizability P in the ferroelectric film 131 increases. When the voltage applied to the gate electrode reaches a program voltage $V_{PGMA}$, the polarizability P of the memory cell MC changes to a certain magnitude. When the application of the voltage to the gate electrode is interrupted in this state, the memory cell MC transitions to the state $S_A$.

The state $S_A$ is a state of the memory cell MC in the A state. The state $S_A$ is a state where the polarizability P is a negative polarizability $P_A$ larger than the polarizability $P_E$ and a voltage applied to the word line WL is the ground voltage $V_{SS}$.

When the positive electrode voltage having the predetermined magnitude or more is applied to the gate electrode of the memory cell MC in the state $S_A$, an electric field between the conductive layer 110 and the semiconductor layer 120 reverses a direction of the polarization in the ferroelectric film 131, and as shown in FIG. 37, the polarizability P in the ferroelectric film 131 increases. When the voltage applied to the gate electrode reaches a program voltage $V_{PGMB}$, the polarizability P of the memory cell MC changes to a certain magnitude. When the application of the voltage to the gate electrode is interrupted in this state, the memory cell MC transitions to the state $S_B$.

The state $S_B$ is a state of the memory cell MC in the B state. The state $S_B$ is a state where the polarizability P is a positive polarizability $P_B$ larger than the polarizability $P_A$ and a voltage applied to the word line WL is the ground voltage $V_{SS}$.

When the positive electrode voltage having the predetermined magnitude or more is applied to the gate electrode of the memory cell MC in the state $S_B$, an electric field between the conductive layer 110 and the semiconductor layer 120 reverses a direction of the polarization in the ferroelectric film 131, and as shown in FIG. 37, the polarizability P in the ferroelectric film 131 increases. When the voltage applied to the gate electrode reaches a program voltage $V_{PGMC}$, the polarizability P of the memory cell MC changes to a certain magnitude and becomes saturated. When the application of the voltage to the gate electrode is interrupted in this state, the memory cell MC transitions to the state $S_C$.

The state $S_C$ is a state of the memory cell MC in the C state. The state $S_C$ is a state where the polarizability P is a positive polarizability $P_C$ larger than the polarizability $P_B$ and a voltage applied to the word line WL is the ground voltage $V_{SS}$. The state $S_C$ is the same as the state $S_2$ described with reference to FIGS. 8 and 10.

When the negative electrode voltage having the predetermined magnitude or more is applied to the gate electrode of the memory cell MC in the state $S_C$, an electric field between the conductive layer 110 and the semiconductor layer 120 reverses a direction of the polarization in the ferroelectric film 131, and as shown in FIG. 37, the polarizability P in the ferroelectric film 131 decreases. When the voltage applied to the gate electrode reaches the erase voltage $V_{era}$, the polarizability P of the memory cell MC changes to a certain magnitude and becomes saturated. When the application of the voltage to the gate electrode is interrupted in this state, the memory cell MC transitions to the state $S_E$.

Next, a method for adjusting the control parameters of the semiconductor storage device according to a second embodiment will be described with reference to FIG. 38.

The method for adjusting the control parameters according to the second embodiment is basically the same as the method for adjusting the control parameters according to the first embodiment. However, in the second embodiment, three program voltages $V_{PGMA}$, $V_{PGMB}$, and $V_{PGMC}$ are used in the write operation. Here, when the characteristics of the ferroelectric film 131 change due to the influences of the above-mentioned electrons or electron holes, as shown in FIG. 38, it is considered that the appropriate magnitudes of the three program voltages $V_{PGMA}$, $V_{PGMB}$, $V_{PGMC}$ all change. Therefore, when the control parameters are updated, all of the three program voltages $V_{PGMA}$, $V_{PGMB}$, $V_{PGMC}$ are increased. In such a case, for example, as illustrated in FIG. 38, an increment of the program voltage $V_{PGMB}$ may be larger than an increment of the program voltage $V_{PGMA}$. An increment of the program voltage $V_{PGMC}$ and an increment of the erase voltage $V_{era}$ may be larger than the increment of the program voltage $V_{PGMB}$.

Other Embodiments

The semiconductor storage devices according to the first embodiment and the second embodiment are described above. However, the above description is merely examples, and the specific configurations, the operation methods, and the like can be adjusted as appropriate.

For example, as described with reference to FIG. 12 and the like, in the write sequence according to a first embodiment, the program operation and the verification operation are alternately executed a plurality of times. However, such a method is merely an example, and a specific method can be appropriately adjusted. For example, the write sequences according to the first embodiment and the second embodiment may include only one program operation. That is, in FIG. 12, only step S102 may be executed once, and step S101 and steps S103 to S108 may be omitted.

For example, as described with reference to FIG. 16 and the like, in the erasing sequence according to a first embodiment, the erasing operation and the erasing verification operation are alternately executed a plurality of times. However, such a method is merely an example, and a specific method can be appropriately adjusted. For example, the erasing sequences according to the first embodiment and the second embodiment may include only one erasing operation. That is, in FIG. 16, only step S202 may be executed once, and step S201 and steps S203 to S208 may be omitted.

For example, in a first embodiment, the source line SL is connected to the semiconductor layer 120 via the P-type semiconductor substrate 100. As described with reference to FIGS. 17 and 18 and the like, in the erasing operation according to the first embodiment, the erase voltage $V_{era}$ is applied to the source line SL, and the voltage $V_{SG}''$ is applied to the source-side select gate line SGS. However, such a method is merely an example, and a specific method can be appropriately adjusted. For example, when the source line SL is connected to the semiconductor layer 120 via an N-type semiconductor, or when the source line SL includes the N-type semiconductor substrate 100, during the erasing operation, gate induced drain leakage (GIDL) may be generated in the source-side select transistor STS, so that the electron holes are generated, and the threshold voltages of the memory cells MC may be adjusted using these electron holes. In such a case, a voltage smaller than the voltage $V_{SG}''$ in FIG. 18 may be applied to the source-side select gate line SGS.

For example, in a first embodiment, the bit line BL is connected to the semiconductor layer 120 via the impurity region 121 containing the N-type impurities. As described with reference to FIGS. 17 and 18 and the like, in the erasing operation according to the first embodiment, the erase voltage $V_{era}$ is not applied to the bit line BL, and the voltage $V_{SG}'$ is applied to the drain-side select gate line SGD. However, such a method is merely an example, and a specific method can be appropriately adjusted. For example, the erase voltage $V_{era}$ may be applied to at least one of the source line SL and the bit line BL. When the erase voltage $V_{era}$ is applied to the bit line BL, during the erasing operation, the GIDL may be generated in the drain-side select transistor STD, so that the electron holes are generated, and the threshold voltages of the memory cells MC may be adjusted using these electron holes. In such a case, a voltage smaller than the voltage $V_{SG}'$ in FIG. 18 may be applied to the drain-side select gate line SGD.

For example, as described with reference to FIG. 5 and the like, the memory cell array MCA according to a first embodiment includes the plurality of conductive layers 110 arranged along the Z direction, the plurality of semiconductor layers 120 extending in the Z direction, and the plurality of gate insulating films 130 provided between the plurality of conductive layers 110 and the plurality of semiconductor layers 120. However, such a configuration is merely an example, and a specific configuration can be appropriately adjusted.

Figure 39:
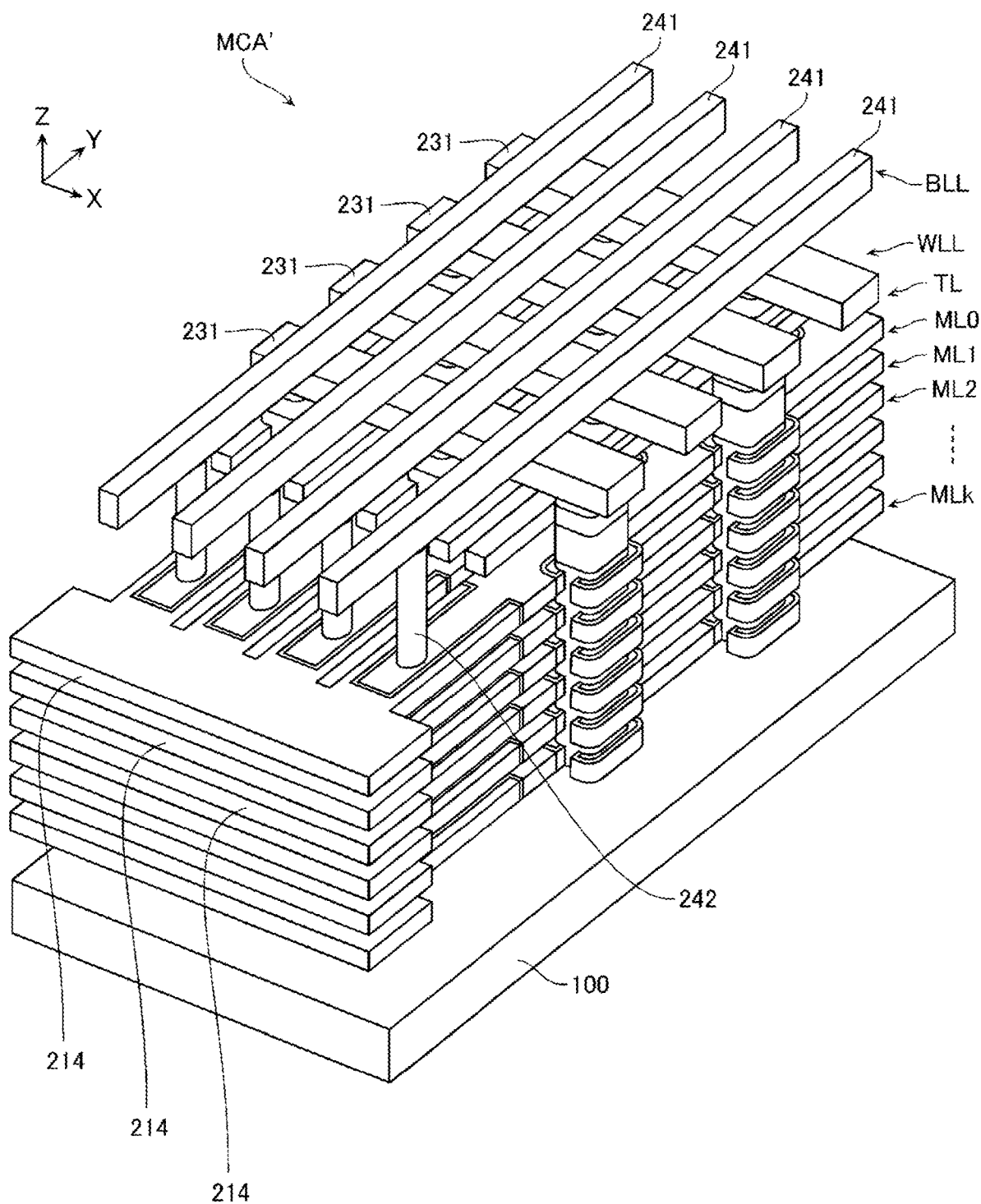
FIG. 39 is a schematic perspective view illustrating a memory cell array according to an embodiment.
Figure 40:
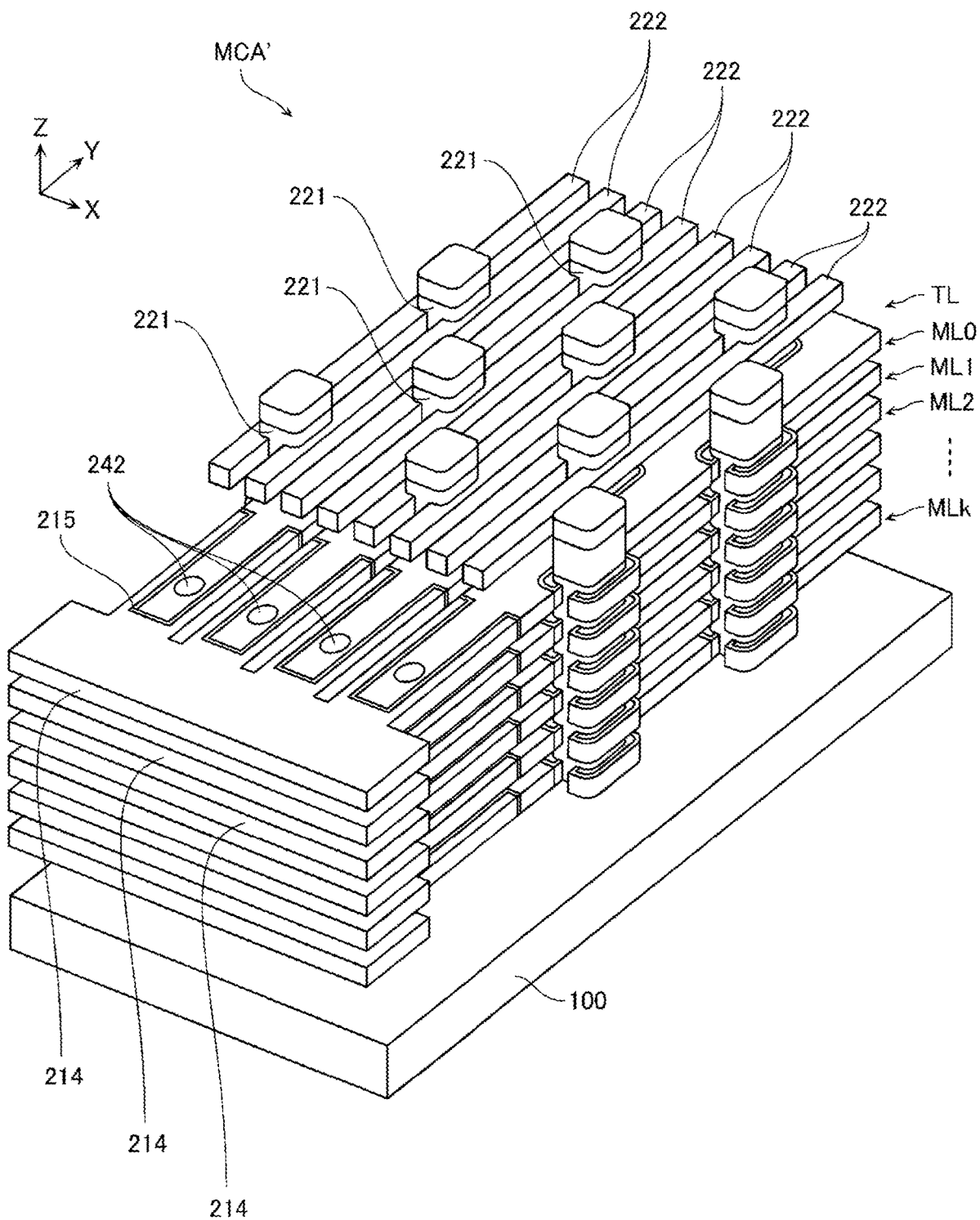
FIG. 40 is a schematic perspective view illustrating a memory cell array according to an embodiment.
Figure 41:
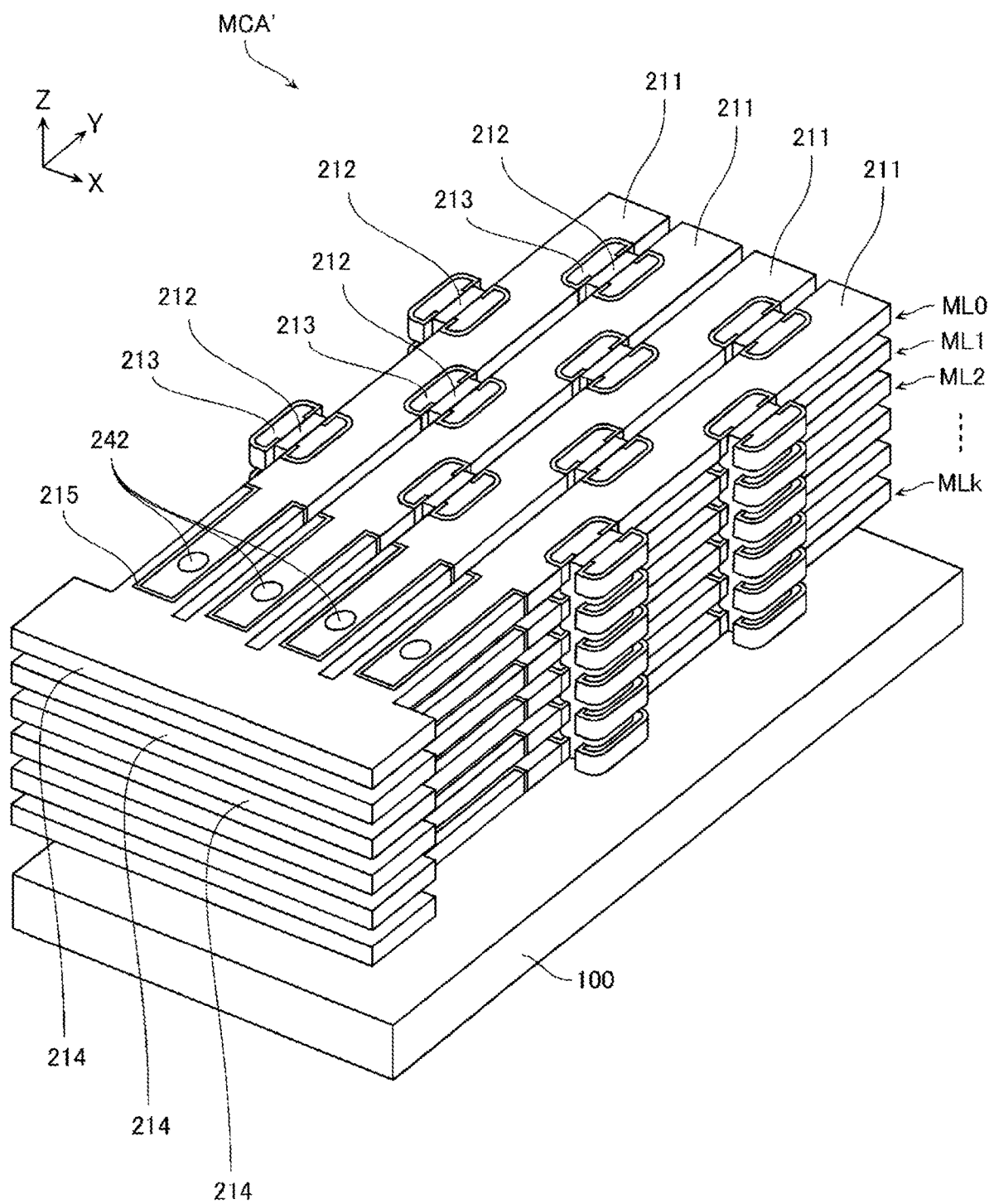
FIG. 41 is a schematic perspective view illustrating a memory cell array according to an embodiment.

For example, a memory cell array MCA' illustrated in FIGS. 39 to 41 includes a plurality of memory layers ML0 to MLk arranged along the Z direction, a transistor layer TL provided above the plurality of memory layers ML0 to MLk, a word line layer WLL provided above the transistor layer TL, and a bit line layer BLL provided above the word line layer WLL. Hereinafter, these configurations will be described in order.

Firstly, the memory layers ML0 to MLk will be described. As shown in FIG. 41, each of the memory layers ML0 to MLk includes a plurality of semiconductor layers 211 that are arranged along the X direction and extend along the Y direction, a part of a plurality of conductive layers 212 arranged along the Y direction among the plurality of semiconductor layers 211, and gate insulating films 213 provided between the semiconductor layers 211 and the conductive layers 212. Each of the memory layers ML0 to MLk includes conductive layers 214 facing end portions of the plurality of semiconductor layers 211 in the Y direction, and gate insulating films 215 provided between the semiconductor layers 211 and the conductive layers 214. The plurality of semiconductor layers 211 are arranged along the X direction.

The semiconductor layer 211 contains, for example, polycrystalline silicon (Si). A side surface of the semiconductor layer 211 in the X direction faces the plurality of conductive layers 212, and functions as the channel region of the memory cell. Two side surfaces in the X direction and a side surface in the Y direction of one end portion of the semiconductor layer 211 in the Y direction face the conductive layer 214, and function as channel regions of the select transistor. One end portion of the semiconductor layer 211 is connected to the conductive layer 242.

The conductive layer 212 includes, for example, a stacked film made of titanium nitride (TiN) and tungsten (W). The conductive layer 212 has, for example, a substantially square columnar shape. The conductive layer 212 extends along the Z direction, and functions as a local word line. The side surfaces of the conductive layers 212 in the X direction face the side surfaces of the semiconductor layers 211 provided in the memory layers ML0 to MLk, and function as the gate electrodes of the memory cells.

The gate insulating film 213 includes the ferroelectric film 131 and the insulating film 132, similarly to the gate insulating film 130 according to the first embodiment. The insulating film 132 is provided between the ferroelectric film 131 and the semiconductor layer 211.

The conductive layer 214 includes, for example, the stacked film made of titanium nitride (TiN) and tungsten (W). The conductive layer 214 has a substantially comb shape. The conductive layer 214 faces the side surface of one end portion of the semiconductor layer 211 in the X direction, and functions as the gate electrode of the select transistor.

The gate insulating film 215 contains, for example, silicon oxide and the like.

Next, the transistor layer TL will be described. As shown in FIG. 40, the transistor layer TL includes a plurality of semiconductor layers 221 arranged along the X and Y directions corresponding to the conductive layers 212, and a plurality of conductive layers 222 that are arranged along the X direction, extend along the Y direction, and face one side surface or the other side surface of the plurality of semiconductor layers 221. A gate insulating film (depicted in FIG. 40 as an empty space) made of silicon oxide ($SiO_2$) or the like is provided between the semiconductor layer 221 and the conductive layer 222.

The semiconductor layer 221 contains, for example, polycrystalline silicon (Si). Two side surfaces of the semiconductor layer 221 in the X direction face the conductive layers 222, and function as channel regions of a word line select transistor. A lower end of the semiconductor layer 221 is connected to the conductive layer 212 (FIG. 41).

The conductive layer 222 includes, for example, the stacked film made of titanium nitride (TiN) and tungsten (W). The conductive layer 222 extends along the Y direction, and functions as a word line selection line. The conductive layers 222 face the side surfaces of the plurality of semiconductor layers 221 in the X direction, and function as the gate electrode of the select transistor. The plurality of semiconductor layers 221 are arranged along the Y direction.

Next, the word line layer WLL will be described. As shown in FIG. 39, the word line layer WLL includes, for example, a plurality of conductive layers 231 arranged along the Y direction.

The conductive layer 231 includes, for example, the stacked film made of titanium nitride (TiN) and tungsten (W). The conductive layers 231 extend along the X direction, and are commonly connected to upper ends of the plurality of semiconductor layers 221 (FIG. 40) arranged along the X direction. Each of the conductive layers 231 functions as a global word line.

Next, the bit line layer BLL will be described. As shown in FIG. 39, the bit line layer BLL includes, for example, a plurality of conductive layers 241 that are arranged along the X direction and extend along the Y direction.

The conductive layer 241 includes, for example, the stacked film made of titanium nitride (TiN) and tungsten (W). The conductive layers 241 are commonly connected to the semiconductor layers 211 of the memory layers ML0 to MLk via conductive layers 242 extending along the Z direction. The conductive layer 241 functions as a bit line Blx. The conductive layer 242 functions as a bit line contact.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of gate electrodes;

a semiconductor layer facing the plurality of gate electrodes;
a gate insulating layer between each of the plurality of gate electrodes and the semiconductor layer, the gate insulating layer having an orthorhombic crystal structure and comprising oxygen and hafnium;
a plurality of first wirings connected to the respective gate electrodes; and
a controller configured to:
execute a write sequence and an erasing sequence by applying voltages to at least one of the first wirings, and
increase either a program voltage to be applied in an initial program operation of the write sequence or an application time of the program voltage in the initial program operation of the write sequence after a total number of executions of the write sequence or the erasing sequence has reached a particular number.

2. The semiconductor storage device according to claim 1, wherein
the controller is further configured to execute, in the write sequence, a program operation a plurality of times, and
after the total number of executions of the write sequence or the erasing sequence has reached the particular number, the increased program voltage is applied to one of the plurality of first wirings in the initial program operation of the write sequence.

3. The semiconductor storage device according to claim 2, wherein the controller is further configured to execute, in the write sequence, a verification operation by applying a verification voltage to one of the plurality of first wirings after each program operation.

4. The semiconductor storage device according to claim 3, wherein the verification voltage applied before the total number of executions of the write sequence or the erasing sequence has reached the particular number is the same as the verification voltage applied after the total number of executions of the write sequence or the erasing sequence has reached the particular number.

5. The semiconductor storage device according to claim 3, wherein the application time of the verification voltage applied before the total number of executions of the write sequence or the erasing sequence has reached the particular number is the same as the application time of the verification voltage applied after the total number of executions of the write sequence or the erasing sequence has reached the particular number.

6. The semiconductor storage device according to claim 1, further comprising:
a second wiring connected to the semiconductor layer, wherein
the controller is further configured to, after the total number of executions of the write sequence or the erasing sequence has reached the particular number, increase either an erasing voltage to be applied to the second wiring in the erasing sequence or an application time of the erasing voltage in the erasing sequence.

7. The semiconductor storage device according to claim 1, wherein the controller is further configured to execute a read operation by applying a read voltage to one of the plurality of first wirings.

8. The semiconductor storage device according to claim 7, wherein the read voltage applied before the total number of executions of the write sequence or the erasing sequence has reached the particular number is the same as the read voltage applied after the total number of executions of the write sequence or the erasing sequence has reached the particular number.

9. The semiconductor storage device according to claim 7, wherein the application time of the read voltage applied before the total number of executions of the write sequence or the erasing sequence reached the particular number is the same as the application time of the read voltage applied after the total number of executions of the write sequence or the erasing sequence has reached the particular number.

10. The semiconductor storage device according to claim 1, wherein the gate insulating layer includes a ferroelectric film.

11. A semiconductor storage device, comprising:
a plurality of gate electrodes;
a semiconductor layer facing the plurality of gate electrodes;
a gate insulating layer between each of the plurality of gate electrodes and the semiconductor layer, the gate insulating layer having an orthorhombic crystal structure and including oxygen and hafnium;
a plurality of first wirings connected to the respective gate electrodes;
a second wiring connected to the semiconductor layer; and
a controller configured to:
execute a write sequence and an erasing sequence by applying voltages to at least one of the first wirings, and
increase either an erasing voltage to be applied to the second wiring in an initial erasing operation of the erasing sequence or an application time of the erasing voltage in the initial erasing operation the erasing sequence after a total number of executions of the write sequence or the erasing sequence has reached a particular number.

12. The semiconductor storage device according to claim 11, wherein
the controller is further configured to execute, in the erasing sequence, an erasing operation a plurality of times, and
after the total number of executions of the write sequence or the erasing sequence has reached the particular number, the increased erasing voltage is applied to the second wiring in the initial erasing operation of the erasing sequence.

13. The semiconductor storage device according to claim 12, wherein the controller is further configured to execute, in the erasing sequence, an erasing verification operation by applying a verification voltage to the first wirings after each erasing operation.

14. The semiconductor storage device according to claim 13, wherein the verification voltage applied before the total number of executions of the write sequence or the erasing sequence has reached the particular number is the same as the verification voltage applied after the total number of executions of the write sequence or the erasing sequence has reached the particular number.

15. The semiconductor storage device according to claim 13, wherein the application time of the verification voltage applied before the total number of executions of the write sequence or the erasing sequence has reached the particular number is the same as the application time of the verification voltage applied after the total number of executions of the write sequence or the erasing sequence has reached the particular number.

16. The semiconductor storage device according to claim 11, wherein the gate insulating layer includes a ferroelectric film.

17. A semiconductor storage device, comprising:
a memory die including a memory cell that includes a gate insulating film having an orthorhombic crystal structure and comprising oxygen and hafnium; and
a controller chip connected to the memory die and configured to:
send a first command to the memory cell for increasing a voltage applied in at least one of a write sequence or an erasing sequence to the memory die after a total number of executions of the write sequence or the erasing sequence reaches a first number, and
send a second command to the memory die for further increasing the voltage after the total number of executions of the write sequence or the erasing sequence reaches a second number that is larger than the first number.

18. The semiconductor storage device according to claim 17, wherein, after sending the first command, the controller chip is configured to not send any command to the memory die for increasing a voltage applied to the memory cell in a read operation until after the sending of the second commands.

19. The semiconductor storage device according to claim 17, wherein the memory cell includes a ferroelectric film.

20. The semiconductor storage device according to claim 17, wherein the controller chip stores a table for storing the total number of executions of the write sequence or the erasing sequence in association with the memory cell.

* * * * *